(12) United States Patent
Nakamura et al.

(10) Patent No.: US 7,914,295 B2
(45) Date of Patent: Mar. 29, 2011

(54) ELECTRICAL CONNECTING DEVICE

(75) Inventors: Yuji Nakamura, Tokyo (JP); Eiji Kobori, Tokyo (JP); Katsumi Suzuki, Tokyo (JP); Takeyuki Suzuki, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 12/500,420

(22) Filed: Jul. 9, 2009

(65) Prior Publication Data

US 2010/0120265 A1 May 13, 2010

(30) Foreign Application Priority Data

Nov. 12, 2008 (JP) .................................. 2008-289872

(51) Int. Cl.
*H01R 12/00* (2006.01)

(52) U.S. Cl. .............................. 439/66; 439/71; 439/331

(58) Field of Classification Search .................. 439/330, 439/331, 65, 71, 73, 72, 66
See application file for complete search history.

(56) References Cited

U.S. PATENT DOCUMENTS

| | | | |
|---|---|---|---|
| 5,069,629 A | 12/1991 | Johnson | |
| 5,207,584 A | 5/1993 | Johnson | |
| 5,254,834 A | 10/1993 | Johnson | |
| 5,336,094 A | 8/1994 | Johnson | |
| 5,360,348 A | 11/1994 | Johnson | |
| 5,388,996 A | 2/1995 | Johnson | |
| 5,634,801 A | 6/1997 | Johnson | |
| 5,639,247 A | 6/1997 | Johnson et al. | |
| 5,645,433 A | 7/1997 | Johnson | |
| 5,749,738 A | 5/1998 | Johnson et al. | |
| 5,841,640 A | 11/1998 | Shibata | |
| 5,888,075 A | 3/1999 | Hasegawa et al. | |
| 5,899,755 A | 5/1999 | Kline | |
| 5,913,687 A | 6/1999 | Rathburn | |
| 5,938,451 A | 8/1999 | Rathburn | |
| 5,947,749 A * | 9/1999 | Rathburn | ......................... 439/66 |
| 6,019,612 A | 2/2000 | Hasegawa et al. | |
| 6,135,783 A | 10/2000 | Rathburn | |
| 6,178,629 B1 | 1/2001 | Rathburn | |
| 6,191,434 B1 | 2/2001 | Sakamoto | |
| 6,203,329 B1 | 3/2001 | Johnson et al. | |
| 6,231,353 B1 | 5/2001 | Rathburn | |

(Continued)

FOREIGN PATENT DOCUMENTS

JP 4-137373 5/1992

(Continued)

*Primary Examiner* — Ross N Gushi
(74) *Attorney, Agent, or Firm* — Finnegan, Henderson, Farabow, Garrett & Dunner, LLP

(57) ABSTRACT

An electrical connecting device for electrically connecting between two contacted articles, comprising a push member, a lock member, which holds one of the contacted articles in a predetermined mount position through the push member, a base member, to which the two contacted articles are mounted, an elastic member held on the base member, and a plurality of contacts held on the elastic member, and wherein the base member includes an upper base member and a lower base member, each including an accommodating recess, which accommodates the elastic member, the elastic member includes slits, respectively, holding the plurality of contacts, the plurality of contacts, respectively, include at least an upper contact arm having an upper contact portion and a lower contact arm having a lower contact portion, and the upper and lower contact portions of each of the plurality of contacts are structured to enable abutting against the elastic member.

6 Claims, 17 Drawing Sheets

U.S. PATENT DOCUMENTS

| | | |
|---|---|---|
| 6,247,938 B1 | 6/2001 | Rathburn |
| 6,409,521 B1 | 6/2002 | Rathburn |
| 6,529,025 B1 | 3/2003 | Kline |
| 6,570,393 B2 | 5/2003 | Johnson |
| 6,572,396 B1 | 6/2003 | Rathburn |
| 6,702,609 B2 | 3/2004 | Suzuki et al. |
| 6,854,981 B2 | 2/2005 | Nelson |
| 6,861,667 B2 | 3/2005 | Gilk et al. |
| 7,029,289 B2 * | 4/2006 | Li ................. 439/66 |
| 7,059,866 B2 | 6/2006 | Gilk |
| 7,121,842 B2 | 10/2006 | Kimura |
| 7,297,003 B2 | 11/2007 | Rathburn et al. |
| 7,303,404 B2 | 12/2007 | Osato et al. |
| 7,326,064 B2 | 2/2008 | Rathburn et al. |
| 7,338,293 B2 | 3/2008 | Gilk |
| 7,422,439 B2 | 9/2008 | Rathburn et al. |
| 2007/0007948 A1 | 1/2007 | Kimura et al. |
| 2007/0032128 A1 | 2/2007 | Lopez et al. |
| 2007/0069763 A1 | 3/2007 | Osato |
| 2007/0202714 A1 | 8/2007 | Sherry |
| 2007/0236236 A1 | 10/2007 | Shell et al. |
| 2008/0006103 A1 | 1/2008 | Sherry |
| 2008/0182436 A1 | 7/2008 | Rathburn |
| 2009/0021274 A1 | 1/2009 | Kimura |

FOREIGN PATENT DOCUMENTS

| | | |
|---|---|---|
| JP | 5-174880 | 7/1993 |
| JP | 6-79480 | 3/1994 |
| JP | 7-73943 | 3/1995 |
| JP | 7-147172 | 6/1995 |
| JP | 7-183072 | 7/1995 |
| JP | 8-130075 | 5/1996 |
| JP | 8-162238 | 6/1996 |
| JP | 8-236237 | 9/1996 |
| JP | 9-148016 | 6/1997 |
| JP | 9-167663 | 6/1997 |
| JP | 10-50440 | 2/1998 |
| JP | 10-116670 | 5/1998 |
| JP | 10-177886 | 6/1998 |
| JP | 10-326653 | 12/1998 |
| JP | 11-31566 | 2/1999 |
| JP | 11-102764 | 4/1999 |
| JP | 11-162605 | 6/1999 |
| JP | 11-242974 | 9/1999 |
| JP | 2000-46871 | 2/2000 |
| JP | 2001-35619 | 2/2001 |
| JP | 2001-135441 | 5/2001 |
| JP | 2001-235510 | 8/2001 |
| JP | 2001-237037 | 8/2001 |
| JP | 2001-257049 | 9/2001 |
| JP | 2001-305184 | 10/2001 |
| JP | 2001-319749 | 11/2001 |
| JP | 2001-524256 | 11/2001 |
| JP | P 2001-326047 | 11/2001 |
| JP | 2002-181881 | 6/2002 |
| JP | 2002-246128 | 8/2002 |
| JP | 2002-280137 | 9/2002 |
| JP | 2002-328149 | 11/2002 |
| JP | 2003-45593 | 2/2003 |
| JP | 2003-86313 | 3/2003 |
| JP | 2003-123874 | 4/2003 |
| JP | 2003-123921 | 4/2003 |
| JP | 2003-217777 | 7/2003 |
| JP | 2003-232805 | 8/2003 |
| JP | 2003-536203 | 12/2003 |
| JP | 2004-61390 | 2/2004 |
| JP | 2004-247194 | 9/2004 |
| JP | 2004-325451 | 11/2004 |
| JP | 2006-216399 | 8/2006 |
| JP | 2006-351474 | 12/2006 |
| JP | 2007-17189 | 1/2007 |
| JP | 2007-17444 | 1/2007 |
| JP | 2007-225599 | 9/2007 |
| JP | 2007-248460 | 9/2007 |
| JP | 2007-309933 | 11/2007 |
| JP | 2007-535094 | 11/2007 |
| JP | 2008-89555 | 4/2008 |
| JP | 2008-96270 | 4/2008 |
| JP | 2008-527649 | 7/2008 |
| WO | WO2005/119856 | 12/2005 |
| WO | WO2006/006248 | 1/2006 |
| WO | WO2006/085388 | 8/2008 |

* cited by examiner

ELECTRICAL CONNECTING DEVICE

CROSS-REFERENCE TO RELATED APPLICATIONS

This application claims the benefit of Japanese Patent Application No. 2008-289872, filed Nov. 12, 2008, which is hereby incorporated by reference herein in its entirety.

BACKGROUND OF THE INVENTION

1. Field of the Invention

The present invention relates to an electrical connecting device for high frequency, and more particular, to an electrical connecting device, such as a semiconductor inspection socket, for electric connection of a semiconductor device for communication of high frequency signals and a circuit board, the electrical connecting device unitizing an elastic member and contacts so as to enable readily adjusting a contact force of and a sliding magnitude of each of the contacts.

2. Description of the Related Art

An electrical connecting device (referred below to as "semiconductor inspection socket") for electric connection between electronic devices, between which a signal is communicated in high frequency, is conventionally known as shown in Japanese Patent Laid-Open No. H10-050440 (1998). Because of communication of high frequency signals, the electrical connecting device is required to decrease a contact, which forms the electrical connecting device, in inductance and to improve an electrical connecting with electronic devices, such as a semiconductor device, a circuit board, etc., as contacted articles. Japanese Patent Laid-Open No. H10-050440 (1998) discloses a semiconductor inspection socket as an electrical connecting device including an elastic member supported on a holder, which forms a socket body, and a substantially Y-shaped contact supported on a socket body being a separate member from the holder and making a signal conductor line length short. The substantially Y-shaped contact of the semiconductor inspection socket comprises an upper contact piece extending obliquely upward and forward, a push piece extending obliquely upward and rearward, and a lower contact piece extending downwardly vertically from a portion, in which the upper contact piece and the push piece intersect each other. Also, an elastic member, which controls displacement magnitude and sliding magnitude of the contact, is arranged between the upper contact piece and the push piece. A tip-end contact portion of the upper contact piece of the contact contacts with a semiconductor device and the upper contact piece turns whereby the tip-end contact portion of the upper contact piece is displaced, and a tip-end contact portion of the lower contact piece contacts with a circuit board to be pushed upward whereby the tip-end contact portion of the lower contact piece is displaced. The respective tip-end contact portions of the upper and lower contact pieces are displaced whereby the elastic member is deformed and its reaction force acts as a contact pressure. Also, as the upper contact piece turns, the respective tip-end contact portions of the upper and lower contact pieces slide horizontally relative to external contacts of the corresponding semiconductor device and the corresponding circuit board to wipe the corresponding external contacts.

The electrical connecting device disclosed in Japanese Patent Laid-Open No. H10-050440 (1998) is constructed so that the contact is supported on the socket body only through the lower contact piece and the elastic member contacts with the upper contact piece and the push piece of the contact only from above. Accordingly, it is difficult to support a plurality of contacts steadily in posture before contact with contacted articles, and, in particular, it is difficult to steadily hold a position of the tip-end contact portion of the upper contact piece whereby contact between the tip-end contact portion of the upper contact piece and a semiconductor device as a contacted article is not stable.

Also, with such electrical connecting device, a semiconductor device and a circuit board as contacted articles may be changed in some cases. In accordance with such change, there is generated a need of changing, that is, adjusting a contact pressure between an upper contact piece and a semiconductor device as a contacted article, a contact pressure between a lower contact piece and a circuit board as a contacted article, sliding magnitudes (wiping magnitudes) of the upper contact piece and the lower contact piece, etc. However, in view of the construction of the conventional, electrical connecting device, it is difficult to independently adjust contact pressures between the contact pieces of the contact and contacted articles and sliding magnitudes of the contact pieces. That is, as described above, since the conventional, electrical connecting device is constructed so that the elastic member contacts with the upper contact piece and the push piece of the contact only from above, the elastic member acts simultaneously on displacements of the upper contact piece and the lower contact piece. Accordingly, for example, when a contact pressure between the tip-end contact portion of the upper contact piece and a contacted article is adjusted, there is a fear that a contact pressure between the tip-end contact portion of the lower contact piece and the contacted article changes and so a desired contact pressure cannot be obtained.

Further, in case of exchanging these contact and elastic member, the work of separately removing and separately mounting the contact and the elastic member is needed to make the exchanging work complex since the contact and the elastic member are separately supported.

In view of these problems, it is an object of the invention to provide an electrical connecting device, which is simple in construction, can hold a contact stably in posture, can readily adjust a contact pressure and a sliding magnitude, and in which exchange can be readily performed.

SUMMARY OF THE INVENTION

In order to attain the object of the invention, an electrical connecting device according to the invention for electrically connecting between two contacted articles, that is, a first contacted article and a second contacted article, comprises a base member, to which the first contacted article and the second contacted article are mounted, an elastic member held on the base member, and a plurality of contacts held on the elastic member, and wherein the base member includes an upper base member and a lower base member, each including an accommodating recess, which accommodates the elastic member, the elastic member includes slits, respectively, extending through the elastic member vertically and holding the plurality of contacts, the plurality of contacts, respectively, include at least an upper contact arm having an upper contact portion capable of contacting with the first contacted article and a lower contact arm having a lower contact portion capable of contacting with the second contacted article, and the upper contact arm and the lower contact arm of each of the plurality of contacts are structured to enable abutting against the elastic member.

Also, with the electrical connecting device according to the invention, the lower contact arm may have the lower contact portion and include a contact projection protruding downward from the lower contact arm.

Further, with the electrical connecting device according to the invention, preferably, the elastic member includes an upper portion and a lower portion, the upper portion and the lower portion being formed deviating back and forth from each other, the slits being formed in a region, in which the upper portion and the lower portion overlap each other, the upper portion of the elastic member is accommodated in a first recess of the upper base member, the lower portion of the elastic member being accommodated in a second recess of the lower base member, and a front portion of the upper portion of the elastic member and a rear portion of the lower portion, respectively, are interposed between the upper base member and the lower base member.

The electrical connecting device according to the invention comprises first and second projections provided at tip ends of the upper contact arm and the lower contact arm of the contact to abut against the elastic member to push the same, and magnitudes, by which the elastic member is pushed, respectively, can be adjusted by the presence of the first and second projections, respectively, and by changing respective magnitudes, by which the first and second projections protrude.

With the electrical connecting device according to the invention, a first space portion is provided rearwardly of a first recess of the upper base member, which accommodates an upper portion of the elastic member, a second space portion is provided forwardly of a second recess of the lower base member, which accommodates a lower portion of the elastic member, and magnitudes, by which the elastic member is pushed by the first and second projections of the contact, respectively, can be adjusted by the presence of the first and second space portions, respectively, and by changing respective sizes of the first and second space portions.

Further, with the electrical connecting device according to the invention, back and forth movements of the upper contact portion of the upper contact arm of the contact and the lower contact portion of the lower contact arm can be adjusted by changing the slits of the elastic member in shape.

Also, the electrical connecting device according to the invention is characterized in that the slit of the elastic member is defined by an upper opening portion, a lower opening portion, and a vertical portion extending vertically between the upper opening portion and the lower opening portion, a front side of the vertical portion includes a first inclined surface inclined forwardly upward, and a rear side of the vertical portion includes a second inclined surface inclined rearwardly downward.

The invention has the above construction to enable stably holding the contacts in posture with a simple construction. Also, it is possible to readily adjust contact pressures between the contacts and two contacted articles independently. Moreover, a sliding magnitude can be readily adjusted. From the above matters, wiping between contact portions of the contacts and contacted articles can be surely performed. Accordingly, contact between these elements can be surely maintained and contact pressures can be made stable. Therefore, it is possible to maintain stable, electric connection between two contacted articles.

Also, by causing the elastic member to hold the contacts, the assembly can be unitized whereby exchange of a contact or the like can be made readily.

Further features of the present invention will become apparent from the following description of exemplary embodiments (with reference to the attached drawings).

DESCRIPTION OF THE EMBODIMENTS

Embodiments of the invention will be described with reference to the drawings.

Figure 1:
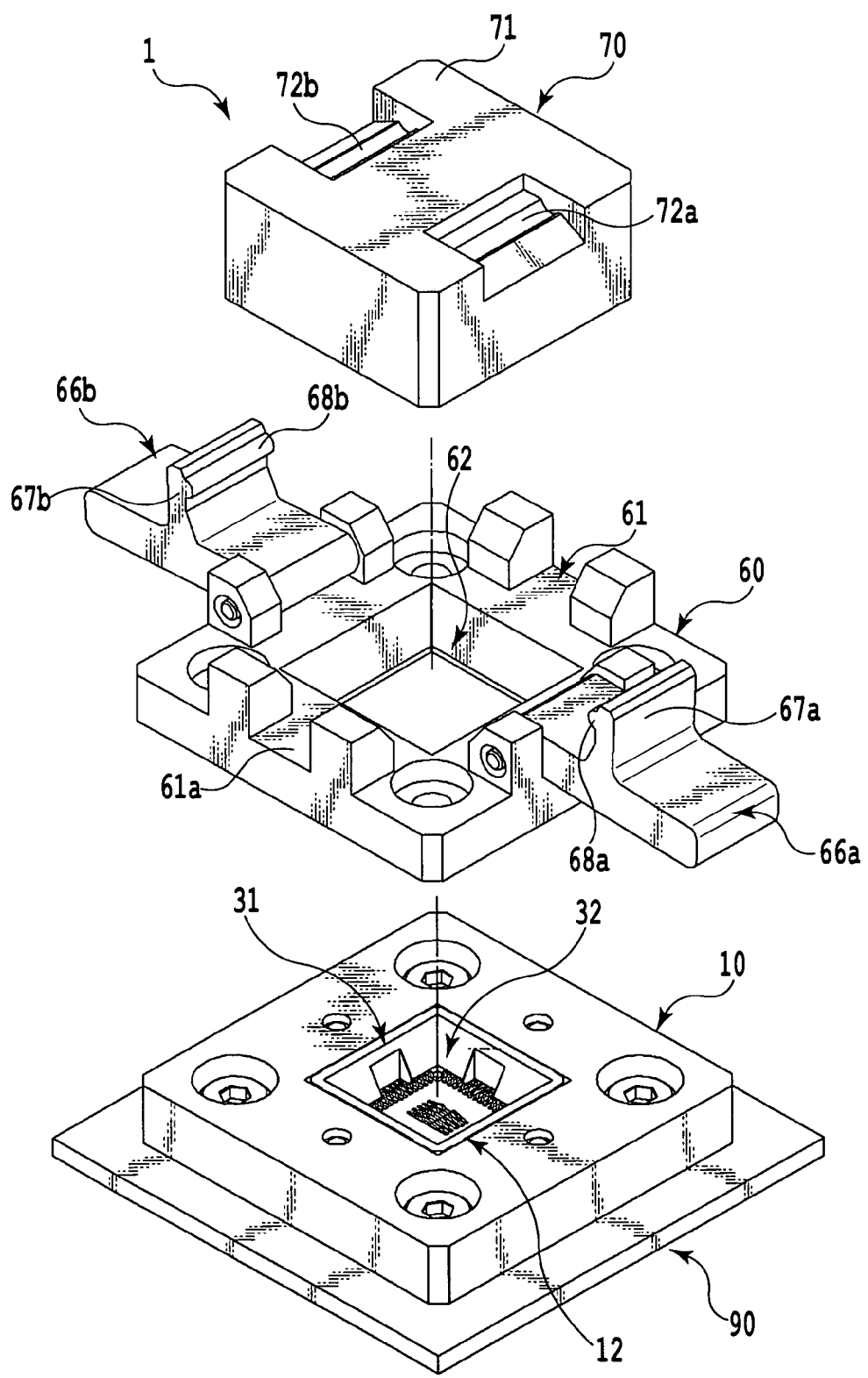
FIG. 1 is an exploded, perspective view showing the whole of an electrical connecting device according to a first embodiment of the invention.
Figure 2:
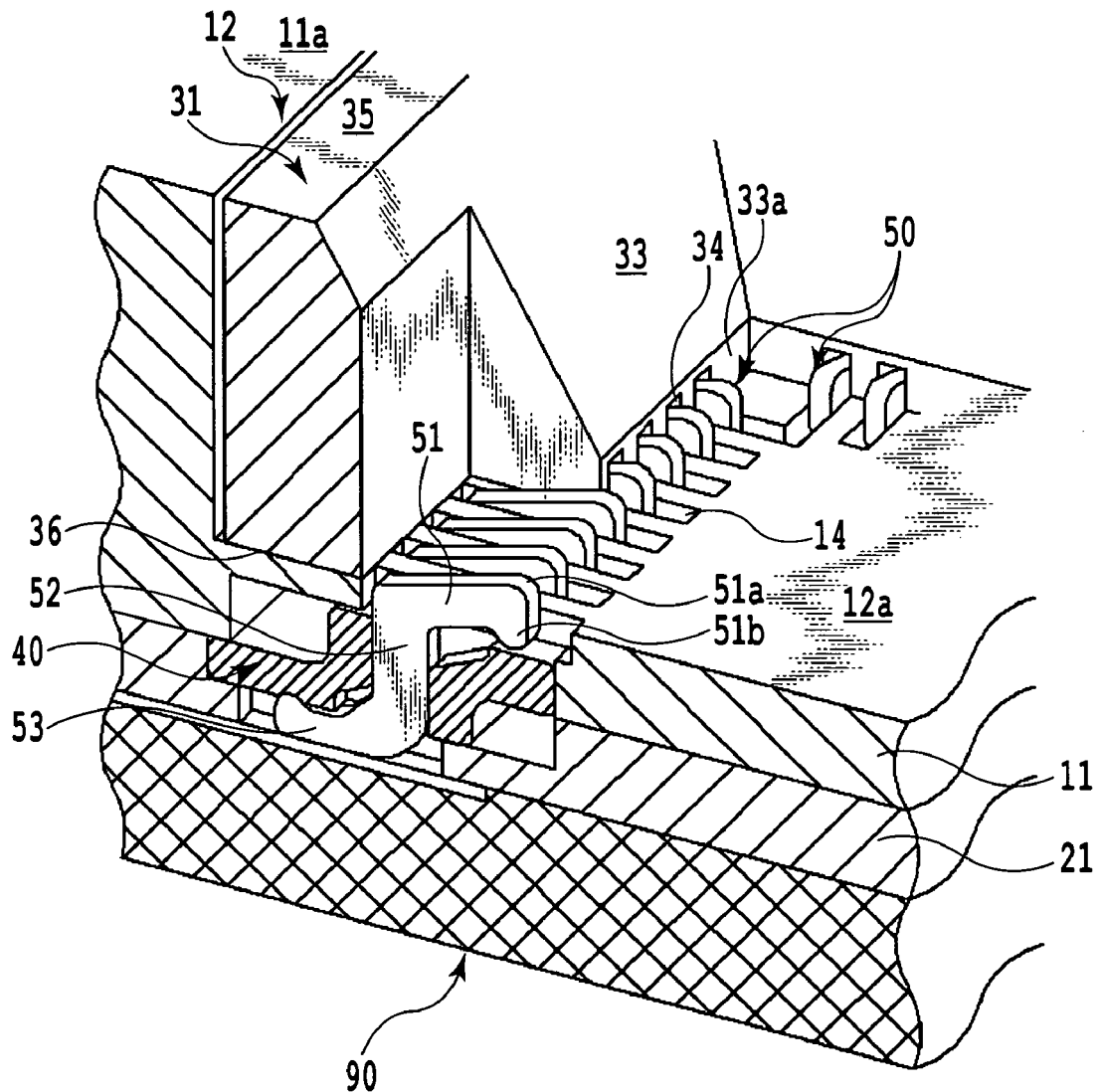
FIG. 2 is a partially enlarged, perspective view including a cross sectional diagram showing the electrical connecting device of FIG. 1.
Figure 3A:
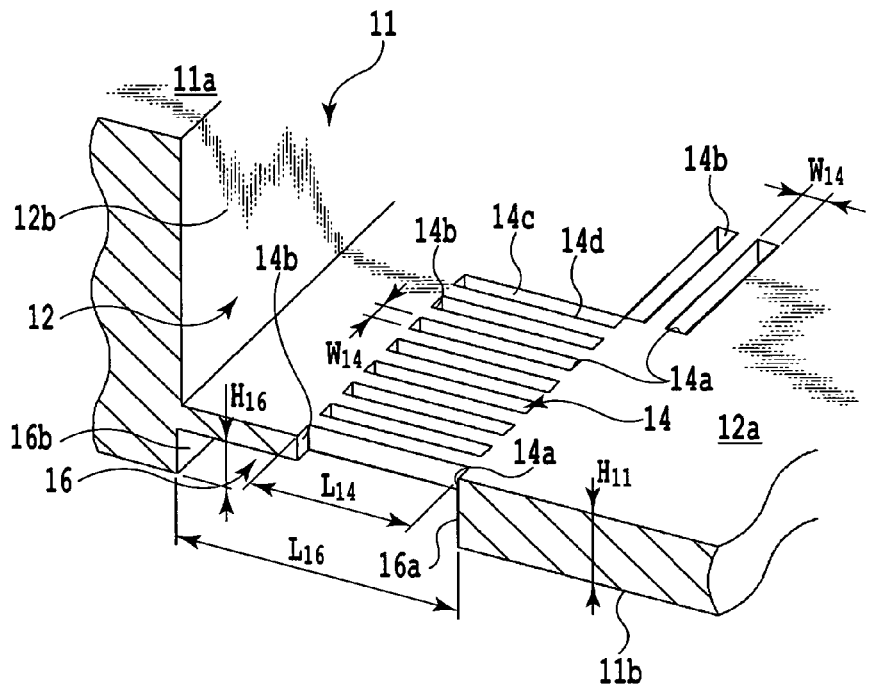
FIG. 3A is a partially enlarged, perspective view showing a base member, which forms the electrical connecting device of FIG. 1, and including a cross sectional diagram showing an upper base member, which forms the base member.
Figure 3B:
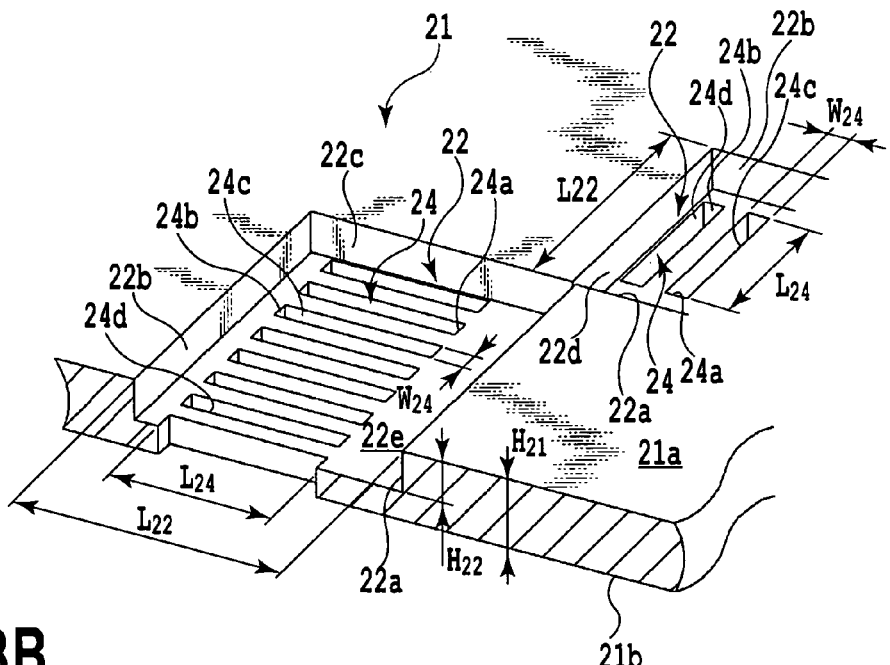
FIG. 3B is a partially enlarged, perspective view showing a base member, which forms the electrical connecting device of FIG. 1, and including a cross sectional diagram showing a lower base member, which forms the base member.
Figure 4:
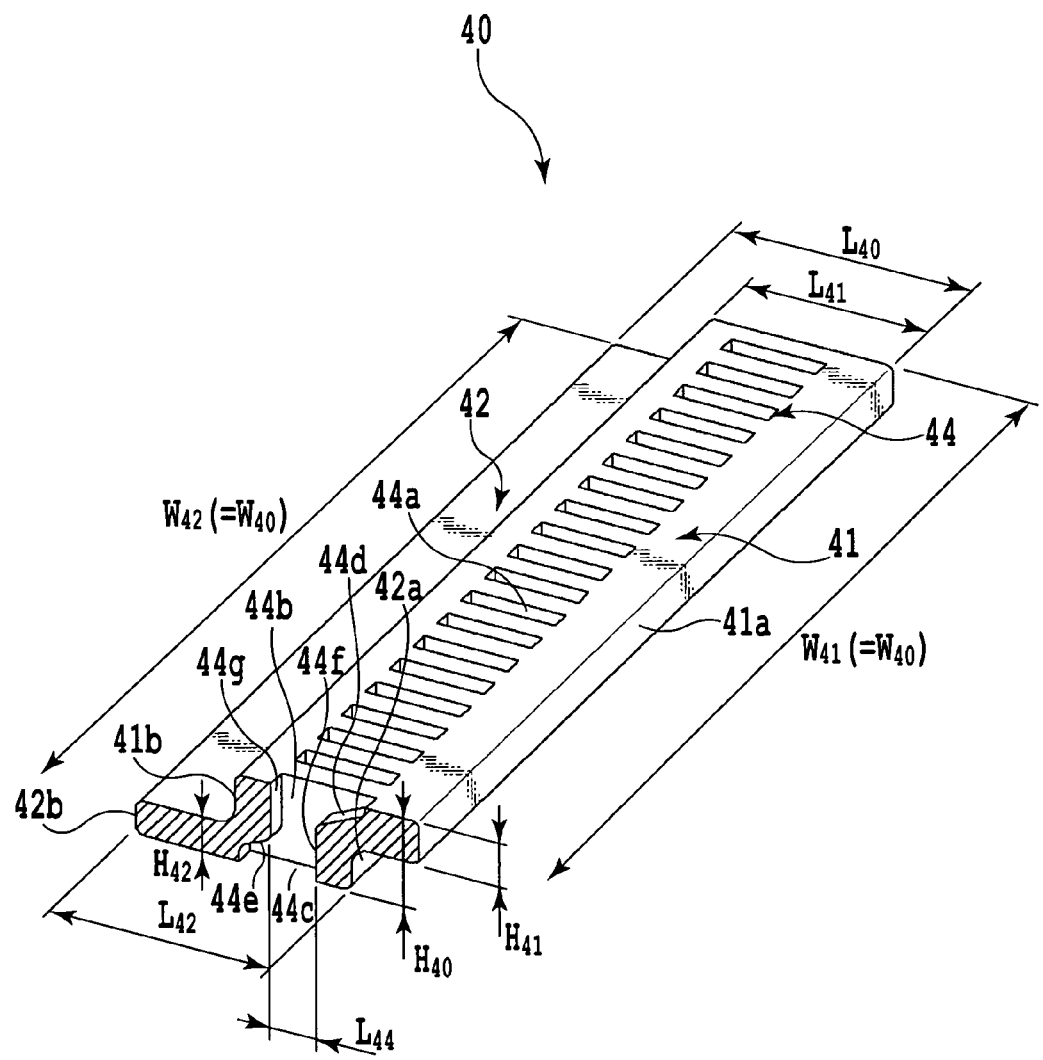
FIG. 4 is a partially enlarged, perspective view including a cross sectional diagram showing a elastic member, which forms the electrical connecting device of FIG. 1.
Figure 5:
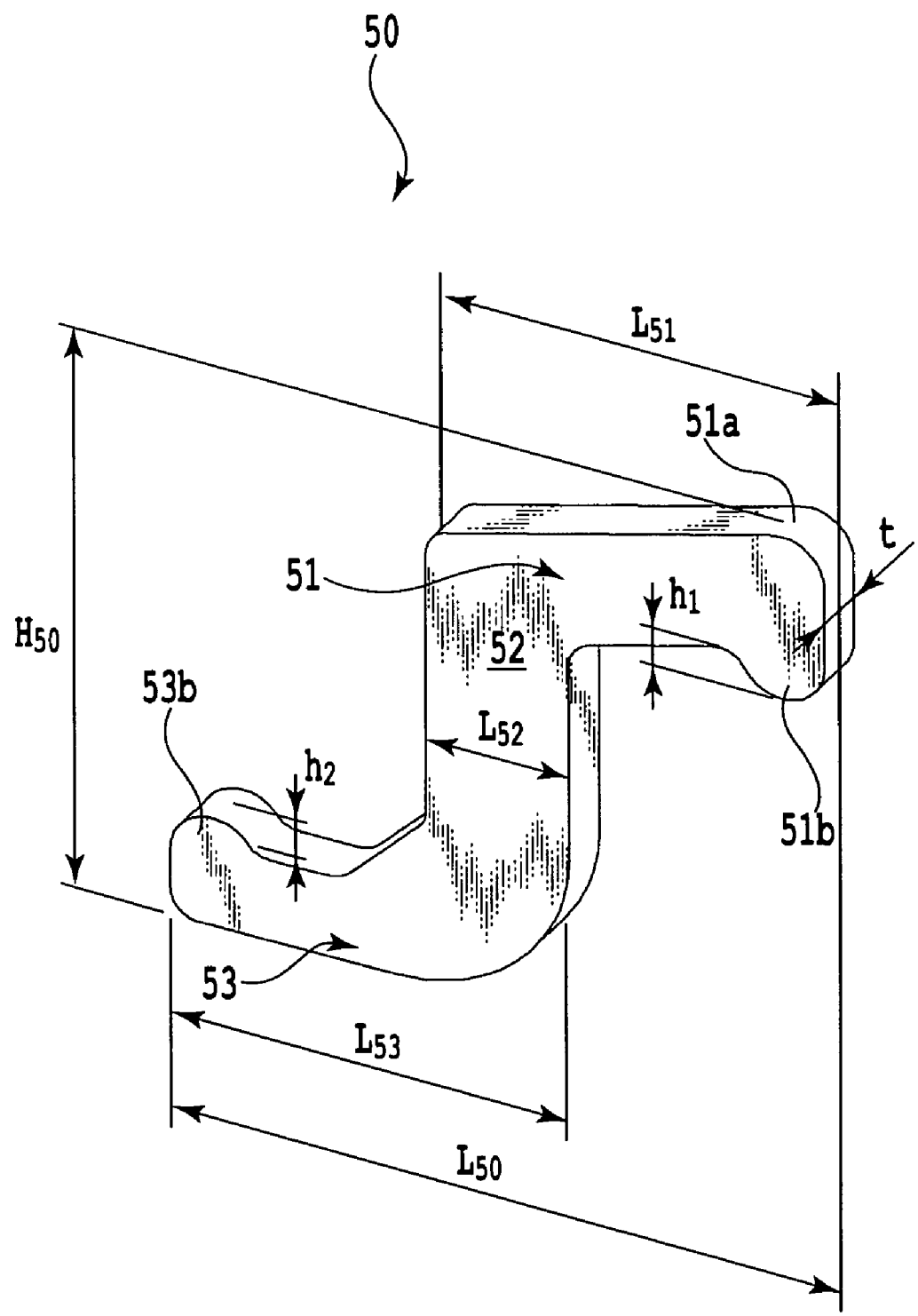
FIG. 5 is a perspective view showing a contact, which forms the electrical connecting device of FIG. 1.
Figure 6:
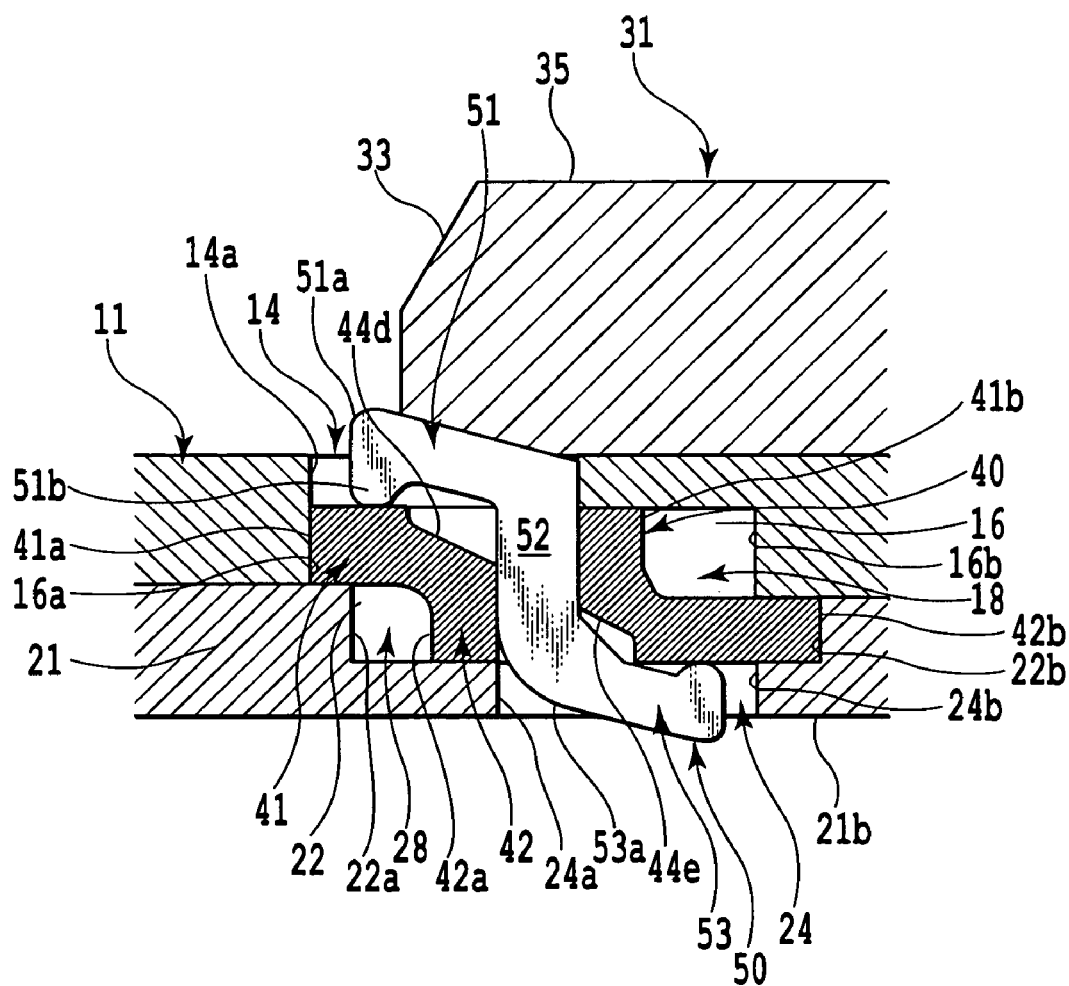
FIG. 6 is a cross sectional diagram showing an essential part of the electrical connecting device of FIG. 1 in a state, in which contacted articles do not contact with a contact.
Figure 7:
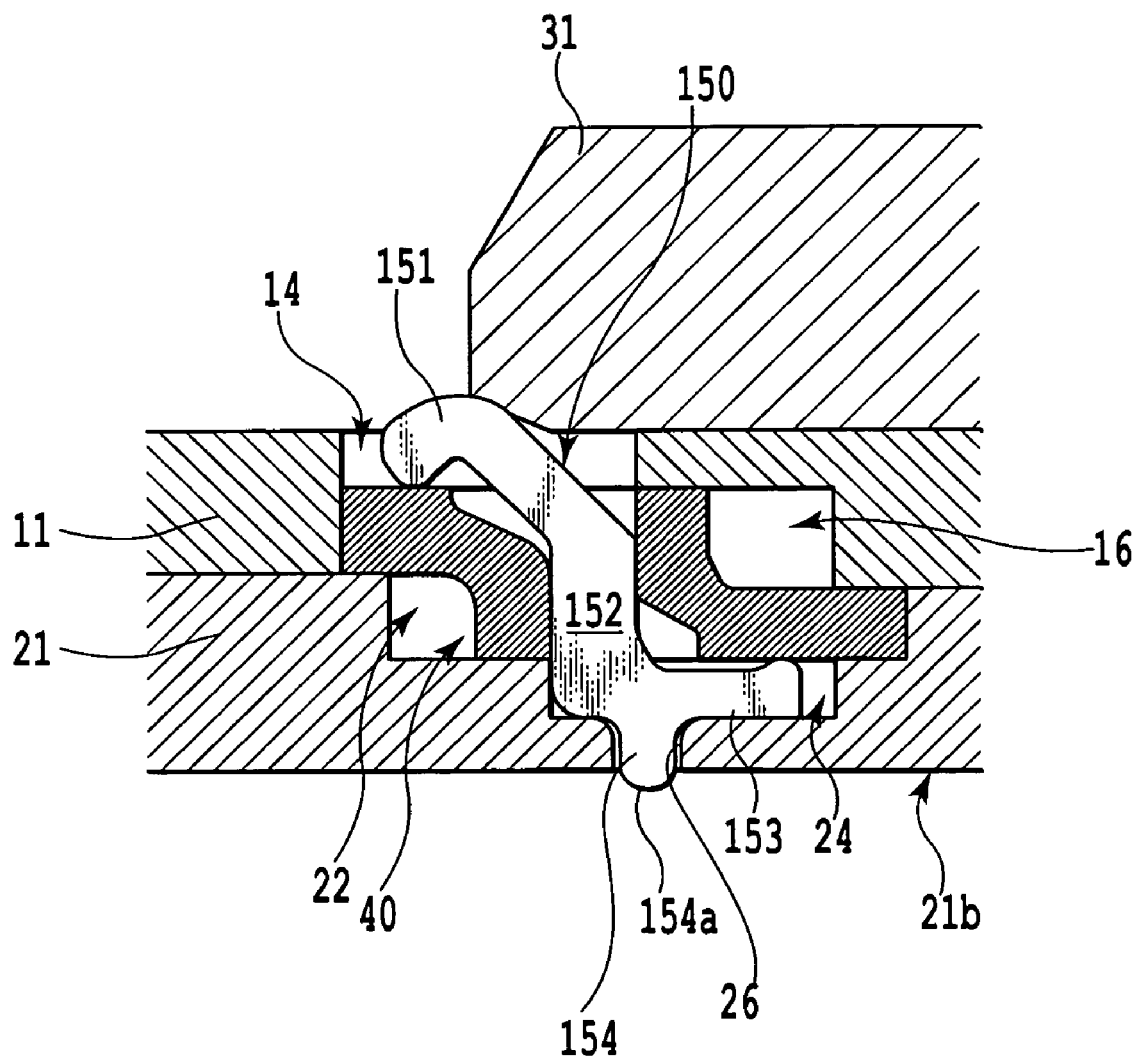
FIG. 7 is similar to FIG. 6 and a cross sectional diagram showing an essential part of an electrical connecting device according to a second embodiment of the invention.
Figure 8:
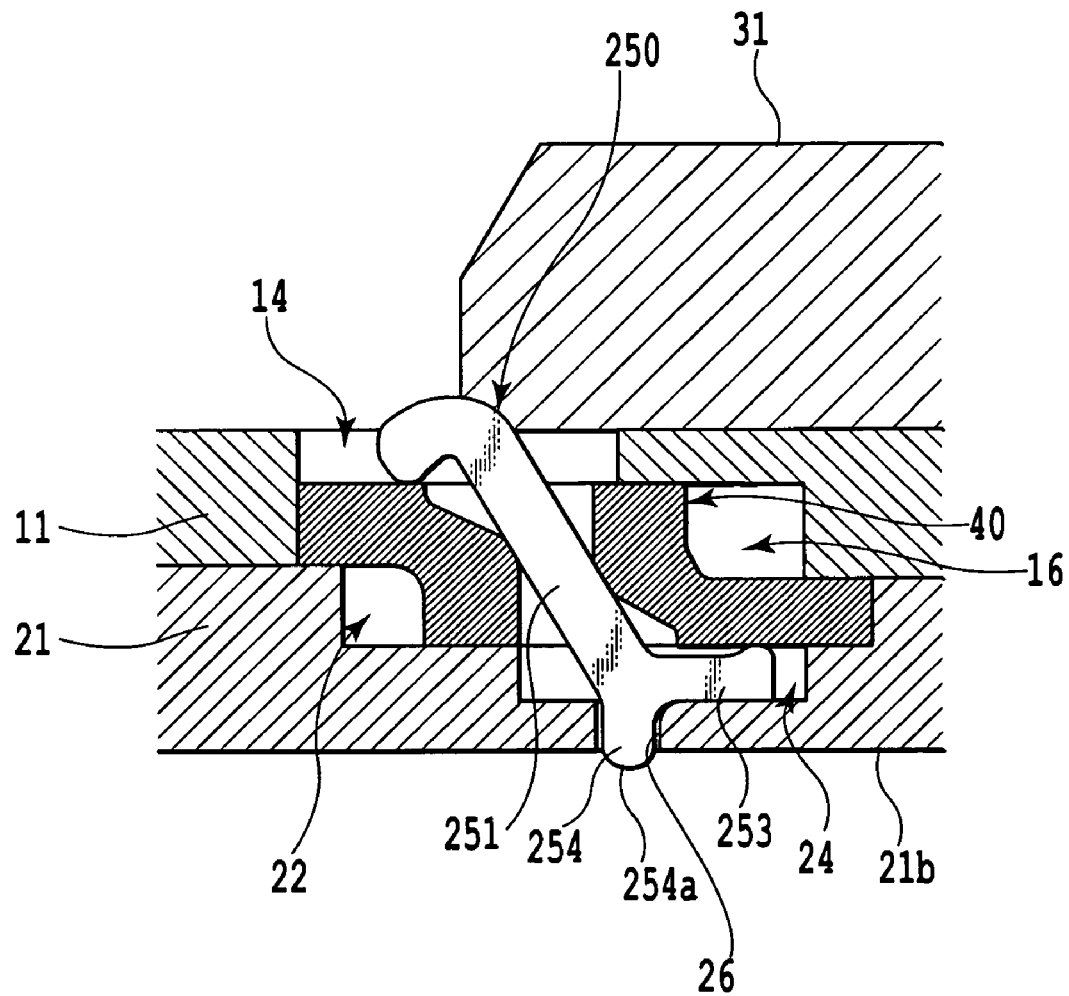
FIG. 8 is similar to FIG. 6 and a cross sectional diagram showing an essential part of an electrical connecting device according to a third embodiment of the invention.
Figure 15:
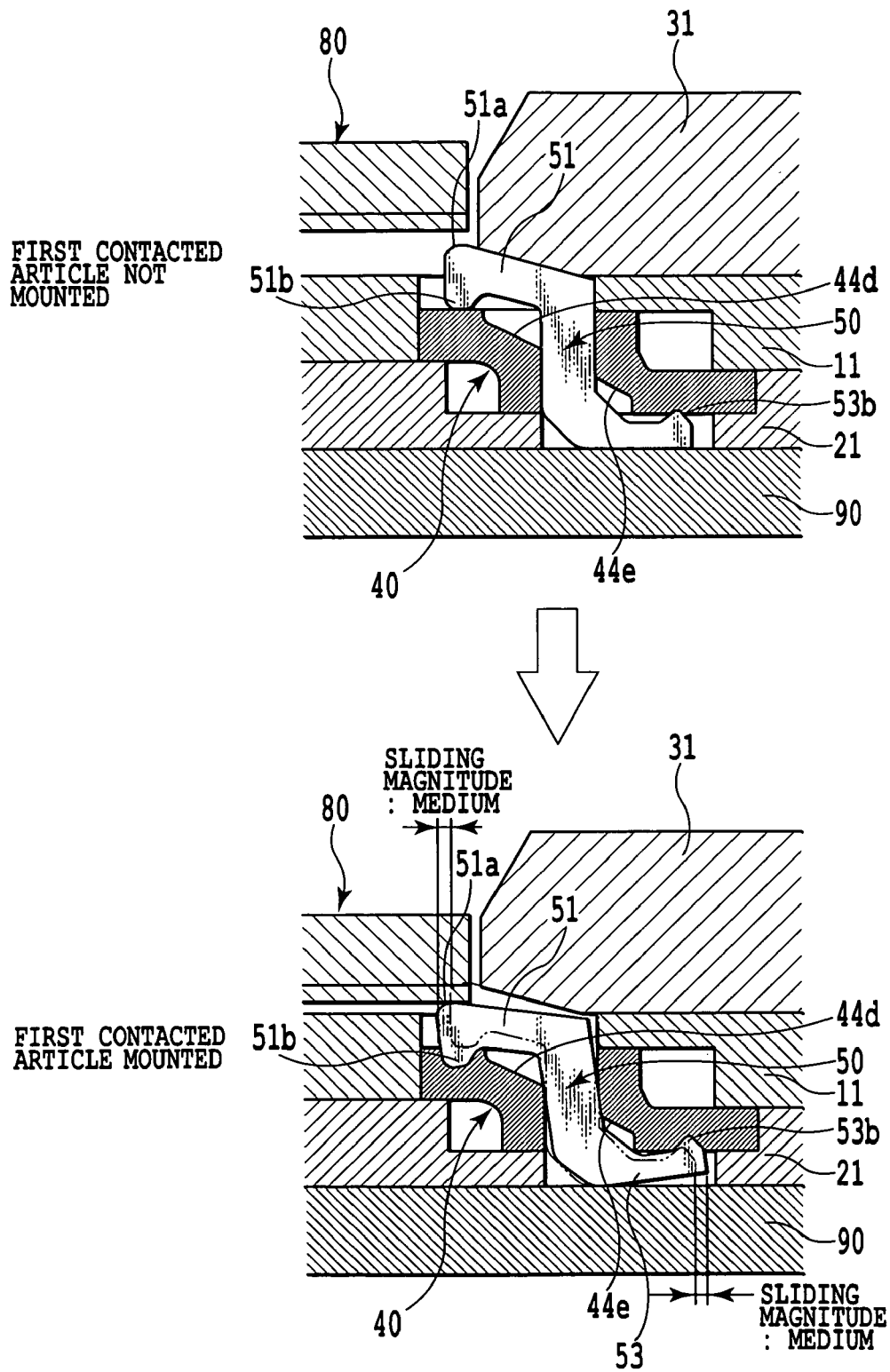
FIG. 15 is a diagram to illustrate an embodiment, in which a sliding magnitude of a contact relative to a contacted article is adjusted, and showing a method of adjusting the sliding magnitude by means of changing a shape of a slit of an elastic member.
Figure 16:
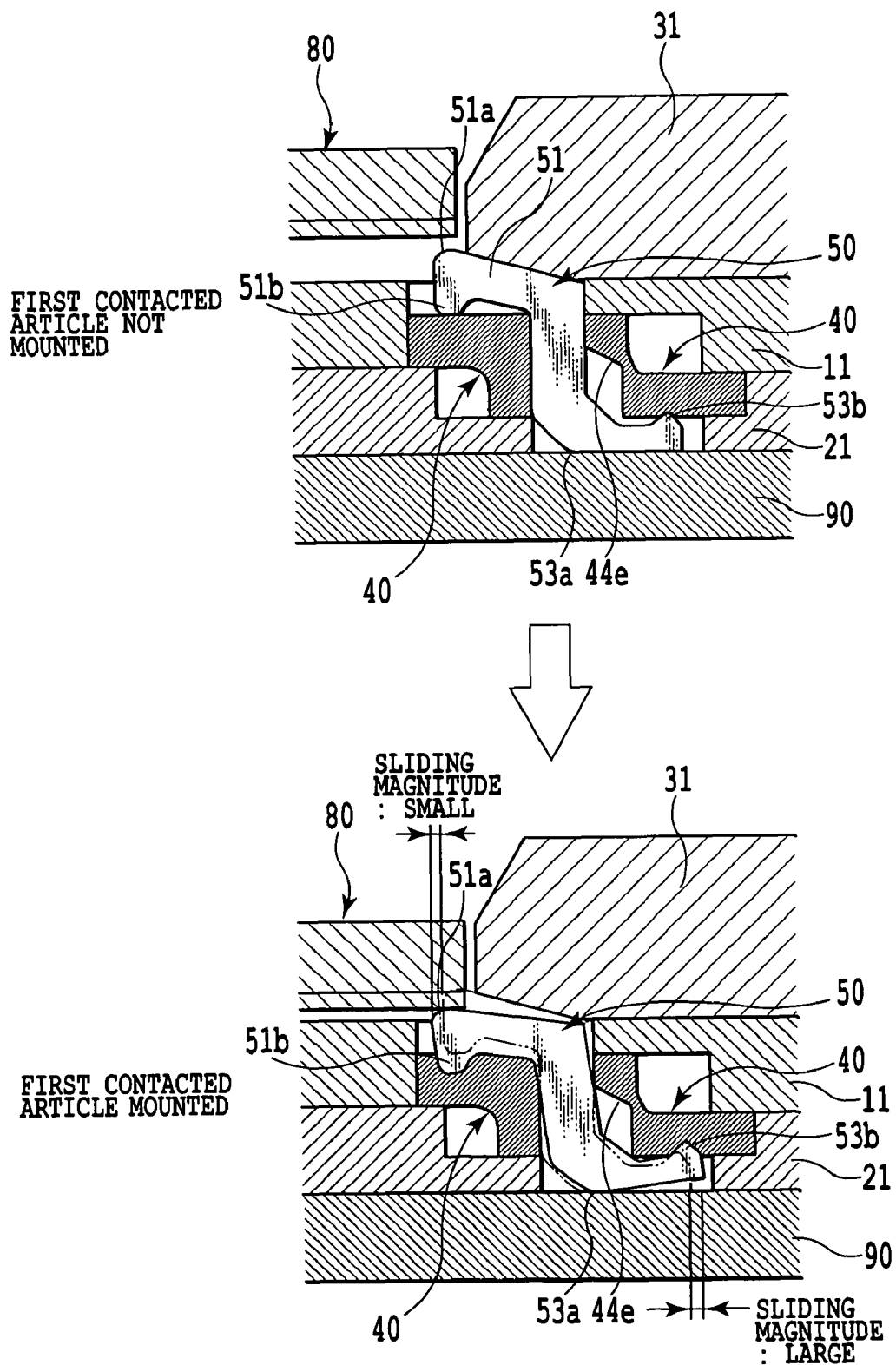
FIG. 16 is a diagram illustrating a manner, in which a sliding magnitude of a contact relative to a contacted article is adjusted, and showing a method of adjusting the sliding magnitude by means of changing a shape of a slit of an elastic member.
Figure 17:
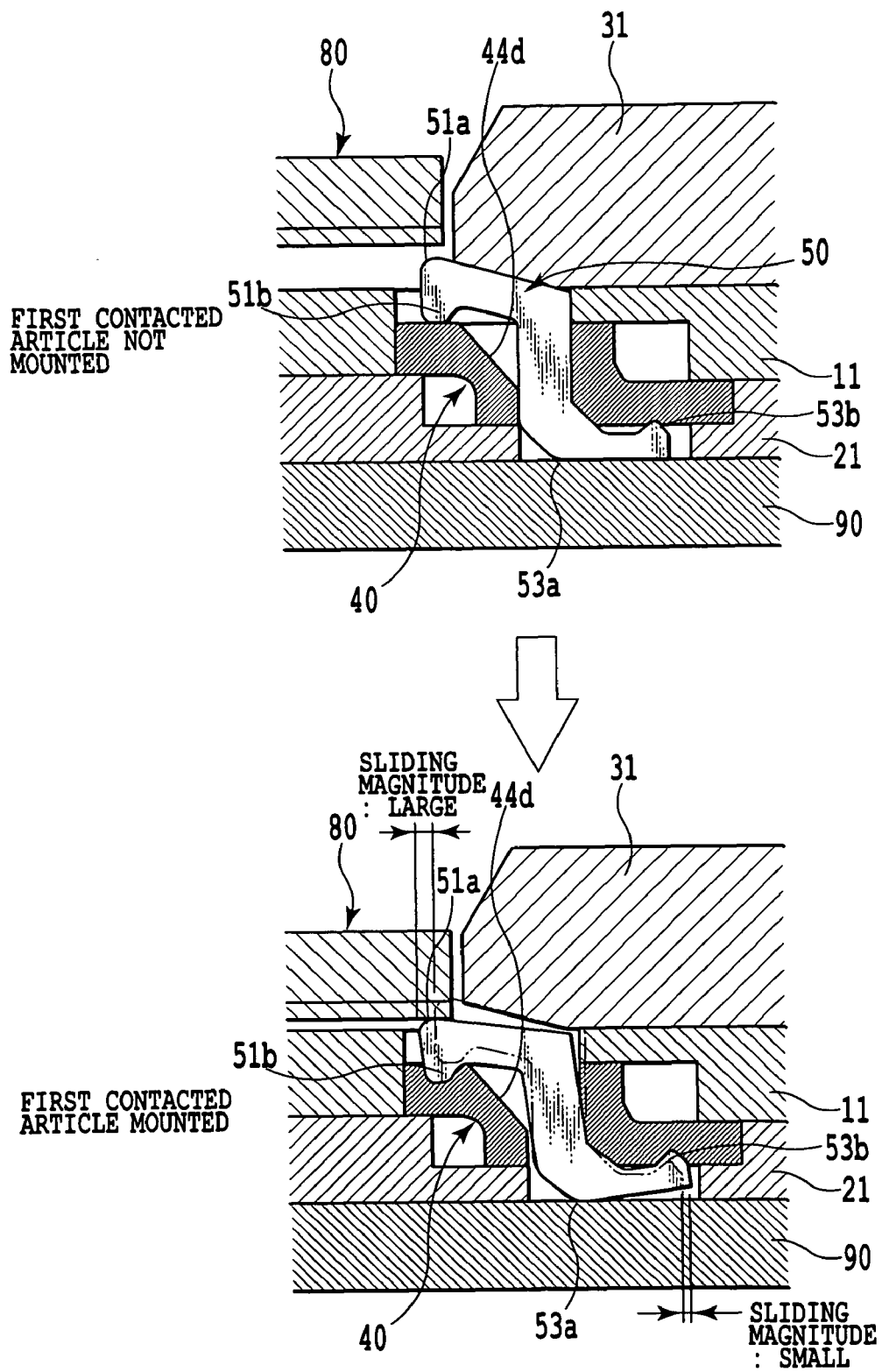
FIG. 17 is a diagram illustrating a manner, in which a sliding magnitude of a contact relative to a contacted article is adjusted, and showing a method of adjusting the sliding magnitude by means of changing a shape of a slit of an elastic member.

FIG. 1 is an exploded, perspective view showing the whole of an electrical connecting device according to a first embodiment of the invention, FIG. 2 is a partially enlarged, perspective view showing the electrical connecting device and including a cross sectional diagram, and FIG. 3A is a partially enlarged, perspective view showing a base member, which forms the electrical connecting device of FIG. 1, and including a cross sectional diagram showing an upper base member, which forms the base member. FIG. 3B is a partially enlarged, perspective view showing a base member, which forms the electrical connecting device of FIG. 1, and including a cross sectional diagram showing a lower base member, which forms the base member. FIG. 4 is a partially enlarged, perspective view including a cross sectional diagram showing an elastic member, which forms the electrical connecting device of FIG. 1. FIG. 5 is a perspective view showing a contact, which forms the electrical connecting device of FIG. 1. FIG. 6 is a cross sectional diagram showing an essential part of the electrical connecting device of FIG. 1 in a state, in which contacted articles do not contact with a contact. FIG. 7 is similar to FIG. 6 and a cross sectional diagram showing an essential part of an electrical connecting device according to a second embodiment of the invention and FIG. 8 is similar to FIG. 6 and a cross sectional diagram showing an essential part of an electrical connecting device according to a third embodiment of the invention. FIGS. 9 to 14 are diagrams to illustrate embodiments, in which a contact pressure between a contacted article and a contact is adjusted, and FIGS. 15 to 17 are diagrams to illustrate embodiments, in which a sliding magnitude of a contact relative to a contacted article is adjusted.

In addition, in the specification of the present application, terms "front" or the like and "rear" or the like, respectively, indicate a side near to a central portion of an electrical connecting device and a side far from the central portion of the electrical connecting device, terms "left" or the like and "right" or the like, respectively, indicate the left and the right toward the central portion of the electrical connecting device, and terms "upper" or the like and "lower" or the like, respectively, indicate an upper side and a lower side relative to the electrical connecting device.

An electrical connecting device 1 according to a first embodiment of the invention will be described with reference to FIGS. 1 to 6.

The electrical connecting device 1 according to the embodiment substantially comprises a base member 10, elastic members 40, a plurality of contacts 50, a lock member 60, and a push member 70. In addition, the reference numeral 80 denotes a semiconductor device serving as a first contacted article and being made a test object. The reference numeral 90 denotes a circuit board, such as test board, serving as a second contacted article. In the embodiment, the semiconductor device 80 and the circuit board 90, respectively, are formed on lower and upper surfaces thereof with external contacts, the both being connected electrically to each other through the electrical connecting device 1.

First, an explanation will be given to the lock member 60 and the push member 70.

The lock member 60 is one, which pushes the semiconductor device 80 placed on the base member 10 downward through the push member 70 to hold the same in a predetermined position. Prior to mounting of the semiconductor device 80, the lock member 60 together with the base member 10 described later is fixed integrally to the circuit board 90. The lock member is formed from an electrically insulating synthetic resin to substantially comprise a body 61 and a pair of latch members 66a, 66b as shown FIG. 1. The body 61 is formed to assume a rectangular parallelepiped being substantially square-shaped in horizontal section and formed centrally thereof with a guide hole 62, which is square-shaped in horizontal section. Accordingly, the body 61 is composed of outer wall portions surrounding the periphery (four sides) of the guide hole 62. The guide hole 62 is sized to allow the semiconductor device 80 to pass therethrough and the push member 70 is accommodated in the guide hole 62 when the semiconductor device 80 is to be mounted to the electrical connecting device 1.

The pair of latch members 66a, 66b are provided on upper surfaces 61a of a pair of outer wall portions of those outer wall portions, which constitute the body 61, to be rotatable relative to the body 61. Provided on the latch members 66a, 66b, respectively, are arms 67a, 67b having latch pawl portions 68a, 68b, respectively, which are latched in engagement recesses 72a, 72b of the push member 70. The arms 67a, 67b, respectively, are formed to protrude upward from predetermined positions on the latch members 66a, 66b, which are opened substantially horizontally in FIG. 1, in a manner to form a substantially right angle to the latch members 66a, 66b. Further, the latch pawl portions 68a, 68b, respectively, are formed to protrude forward from tip end positions of the arms 67a, 67b, which extend upward in FIG. 1, in a manner to form a right angle to the arms 67a, 67b.

When the semiconductor device 80 is loaded on the electrical connecting device 1, the latch members 66a, 66b, respectively, turn 90 degrees forward from an opened state in FIG. 1 to be maintained in a closed state with the latch pawl portions 68a, 68b engaged with the engagement recesses 72a, 72b of the push member 70. At this time, the semiconductor device 80 mounted to the electrical connecting device 1 contacts with the contacts 50 with a predetermined contact pressure to be connected electrically thereto.

The push member 70 is one, which is accommodated in the guide hole 62 of the lock member 60 to push down the semiconductor device 80 to hold the semiconductor device 80 in a predetermined position. The push member 70 is formed from an electrically insulating synthetic resin to assume a rectangular parallelepiped being substantially square-shaped in horizontal section and comprises, on a horizontal, upper surface 71 thereof, a pair of the engagement recesses 72a, 72b enabling engaging with the latch pawl portions 68a, 68b formed on the latch members 66a, 66b of the lock member 60.

In the embodiment, while the lock member 60 and the push member 70 are formed as separate members, this is not limitative. As disclosed in, for example, Japanese Patent Laid-Open No. H10-050440 (1998), the lock member 60 and the push member 70 may be formed as a unitary member and further may be mounted rotatably to the base member 10.

Also, instead of the lock member 60 and the push member 70, the semiconductor device 80 may be pushed down by the use of a handler device, which serves to convey the semiconductor device 80 to a predetermined position on the electrical connecting device 1.

Subsequently, an explanation will be given to the base member 10. The base member 10 is formed from an electrically insulating synthetic resin to comprise an upper base member 11, a lower base member 21, and a positioning member 31 as shown in FIGS. 2 and 3A. Arranged between the upper base member 11 and the lower base member 21 are units, in which the plurality of contacts 50 are arranged one by one in a plurality of slits 44 provided on the elastic members 40 as described later.

In the embodiment, the upper base member 11 assumes a rectangular parallelepiped being substantially square-shaped in horizontal section and includes a horizontal, upper surface 11a, a horizontal, lower surface 11b in parallel to the horizontal, upper surface 11a, and four side surfaces perpendicular to the horizontal, upper surface 11a and the horizontal, lower surface 11b. In addition, adjacent side surfaces are perpendicular to each other. An accommodating recess 12 being opened upward and substantially square-shaped in horizontal section is formed centrally of the upper surface 11a of the upper base member 11. The positioning member 31 is arranged in the accommodating recess 12 and the semiconductor device 80 is inserted from above the recess 12 to be positioned by the positioning member 31 to be accommodated and held in a predetermined mount position.

The accommodating recess 12 includes a substantially square-shaped bottom surface 12a formed as a horizontal surface in parallel to the upper surface 11a of the upper base member 11 and four side surfaces 12b surrounding the periphery of the bottom surface 12a to be made perpendicular to the bottom surface 12a. A plurality of first, elongate slits 14 arranged along the four side surfaces 12b are provided on the bottom surface 12a of the accommodating recess 12 as shown in FIGS. 2 and 3A.

The plurality of first slits 14 are formed on the whole periphery of the bottom surface 12a in a manner to surround a substantially square-shaped central, flat portion of the bottom surface 12a of the accommodating recess 12. The first slits 14 extending along each of the side surfaces 12b of the accommodating recess 12 are respectively in parallel to one another to extend perpendicularly to each of the side surfaces 12b and to extend through the upper base member 11 to be opened downward. The first, elongate slits 14 comprise four side surfaces, that is, front and rear side surfaces 14a, 14b and left and right side surfaces 14c, 14d. In addition, adjacent side surfaces are perpendicular to each other. As shown in FIG. 3A, $L_{14}$ indicates a longitudinal length (a distance between the front side surface 14a and the rear side surface 14b) of the first slit 14. $W_{14}$ indicates a crosswise length (width) (a distance between the left side surface 14c and the right side surface 14d). Arranged in the first slits 14 are upper contact arms 51 including respective, upper contact portions 51a of the contacts 50. It is understood from this that the length $L_{14}$ of the first, elongate slit 14 is larger than a longitudinal length $L_{51}$ of the upper contact arm 51 of the contact 50 thus arranged and the width $W_{14}$ of the first slit 14 is a little larger than a width (thickness) t of the contact 50.

Formed on the lower surface 11b of the upper base member 11 are first recesses 16 downwardly opened corresponding to the first slits 14. The first recesses 16 comprise a bottom surface 16c and four side surfaces perpendicular to the bottom surface 16c, that is, front and rear side surfaces 16a, 16b, and left and right side surfaces (not shown). Accordingly, the first recesses 16 are communicated to the accommodating recess 12 through the plurality of first slits 14. In addition, adjacent side surfaces are perpendicular to each other. While being not limitative, the front side surface 16a of the first recess 16 is preferably formed to be made flush with the front side surface 14a of the first slits 14. Also, while being not limitative, the rear side surfaces 16b of the first recesses 16 are preferably formed in the vicinity of positions of lower extensions of the side surfaces 12b of the accommodating recess 12, to which the first slits 14 correspond.

The first recesses 16 have a larger length (a distance between the front side surface 16a and the rear side surface 16b) $L_{16}$ than the length $L_{14}$ of the first slits 14 and have at least a width $W_{16}$ (not shown) (a distance between the left side surface and the right side surface) covering all the plurality of first slits 14 arranged in parallel. The first recesses 16 are four in number and formed on the lower surface 11b so that the four, first recesses 16 surround a substantially square-shaped central, flat portion of the lower surface 11b of the upper base member 11.

An upper portion 41 of the elastic member 40 holding the contacts 50 is accommodated in the first recess 16 as described later. It is understood from this that the length $L_{16}$ of the first recesses 16 is equal to or larger than a length $L_{41}$ of the upper portions 41 of the elastic members 40 and the width $W_{16}$ of the first recesses is equal to or a little larger than a width $W_{41}$ of the upper portions 41 of the elastic members 40. Also, a height (a distance between the lower surface 11b of the upper base member 11 and the bottom surfaces 16c of the first recesses 16) $H_{16}$ is substantially equal to a height (thickness) $H_{41}$ of the upper portions 41.

Subsequently, the positioning member 31 in the embodiment is one, which guides the semiconductor device 80 so that external contacts of the semiconductor device 80 inserted from above the electrical connecting device 1 come into contact with the contacts 50. The positioning member 31 is arranged in the accommodating recess 12 of the upper base member 11.

The positioning member 31 assumes a rectangular parallelepiped being substantially square-shaped in horizontal section as shown in FIGS. 1 and 2 and is formed as a rectangular-shaped cylinder, four sides of which are surrounded by substantially vertical, outer wall portions. The positioning member 31 includes a horizontal, upper surface 35, a horizontal, lower surface 36 of the outer wall portions, and a guide cavity 32 surrounded by the outer wall portions, extending vertically, and being square-shaped in horizontal section. Four peripheral surfaces (inner surfaces of the outer wall portions) of the guide cavity 32 are formed as inclined guide surfaces 33 so that the guide cavity 32 becomes thin as it goes downward. A square area of an upper-end opening of the guide cavity 32 is set to be larger than an area of a horizontal section of the semiconductor device 80 thus guided. A square area of a lower-end opening is set to be substantially the same as the area of the horizontal section of the semiconductor device 80. In addition, lower portions of the inclined guide surfaces 33 are preferably formed as vertical surfaces 33a as shown in FIG. 2.

Also, a plurality of third slits 34 opened downward and forward are formed on the horizontal, lower surface 36 of the outer peripheral walls of the positioning member 31. The upper contact portions 51a of the upper contact arms 51 of the contacts 50 are accommodated in the plurality of third slits 34. Accordingly, the plurality of third slits 34 correspond to the plurality of first slits 14 formed on the bottom surface 12a of the accommodating recess 12 and are formed to have the same length and the same width as those of the first slits 14.

Subsequently, the lower base member 21 assumes a rectangular parallelepiped being substantially square-shaped in horizontal section and includes a horizontal, upper surface 21a, a horizontal, lower surface 21b in parallel to the horizontal, upper surface 21a, and four side surfaces perpendicular to the horizontal, upper surface 21a and the horizontal, lower surface 21b.

Second, four recesses 22 upwardly opened are formed on the upper surface 21a of the lower base member 21 in a manner to surround a substantially square-shaped central, flat portion thereof. The second recesses 22 comprise a bottom surface 22e, four side surfaces perpendicular to the bottom surface 22e, that is, front and rear side surfaces 22a, 22b, and left and right side surfaces 22c, 22d, respectively. In addition, adjacent side surfaces are perpendicular to each other.

The second recesses 22, respectively, are formed corresponding to the first recesses 16 formed on the lower surface 11b of the upper base member 11. That is, when the upper base member 11 and the lower base member 21 are assembled as the base member 10, the second, four recesses 22, respectively, are arranged to face the first, four recesses 16. However, the second recesses 22 are arranged to be positioned rearwardly of the first recesses 16. In other words, the second, four recesses 22, respectively, are formed so that the front side surface 22a and the rear side surface 22b of each of the second recesses 22, respectively, are positioned rearwardly of the front side surface 16a and the rear side surface 16b of the corresponding first recess 16. In addition, the left side surface 22c and the right side surface 22d of each of the second recesses are formed to be made flush with the left side and the right side of the corresponding first recess 16.

Lower portions 42 of the elastic members 40 are accommodated in the second recesses 22. It is understood from this that the respective second recesses 22 have a length (a distance between the front side surface 22a and the rear side surface 22b) $L_{22}$ equal to or larger than a length $L_{42}$ of the lower portions 42 of the elastic members 40. Likewise, it is understood that the second recesses 22 have at least a width $W_{22}$ (not shown) (a length between the left side surface 22c and the right side surface 22d) equal to or a little larger than a width $W_{42}$ (=$W_{41}$) of the lower portions 42 of the elastic members 40. Also, a height (a distance between the upper surface 21a of the lower base member 21 and the bottom surfaces 22e of the second recesses 22) $H_{22}$ of the second recesses 22 is substantially equal to a height (thickness) $H_{42}$ of the lower portions 42 of the elastic members 40.

In this manner, by forming the first recesses 16 and the second recesses 22, both front portions of the upper portions 41 of the elastic members 40 and rear portions of the lower portions 42 are interposed between the upper base member 11 and the lower base member 21 though being partially. Thereby, the elastic members 40 are surely and stably held in the base member 10.

As shown in FIG. 3B, a plurality of second, elongate slits 24 arranged along the rear side surface 22b are provided on the bottom surface 22e of each of the second recesses 22. The respective, second slits 24 are in parallel to one another to extend perpendicularly to the rear side surface 22b and to extend through the lower base member 21 to be opened downward in the embodiment.

The second, elongate slits 24 comprise four side surfaces, that is, front and rear side surfaces 24a, 24b and left and right side surfaces 24c, 24d. In addition, adjacent side surfaces are perpendicular to each other. As shown in FIG. 3B, $L_{24}$ indicates a longitudinal length (a distance between the front side surface 24a and the rear side surface 24b) of the second slits 24 and $W_{24}$ indicates a crosswise length (width) (a distance between the left side surface 24c and the right side surface 24d). Arranged in the second slits 24 are lower contact arms 53 including respective, lower contact portions 53a of the contacts 50. It is understood from this that the length $L_{24}$ of the second, elongate slits 24 is larger than a longitudinal length $L_{53}$ of the lower contact arms 53 of the contacts 50 thus arranged. Likewise, it is understood that the width $W_{24}$ of the second slits 24 is the same as the width $W_{14}$ of the first slits 14 and a little larger than a width (thickness) t of the contacts 50.

As described above, by forming the upper base member 11 and the lower base member 21, the base member 10 including the plurality (four in the embodiment) of the elastic members 40 and the plurality of the contacts 50 can be readily assembled. Specifically, one unit is formed by first arranging the plurality of the contacts 50, respectively, in the slits 44 provided on each of the elastic members 40 as described later.

Succeedingly, four units, respectively, composed of the elastic member 40 and the plurality of the contacts 50 are arranged on the lower base member 21 so that the lower portions 42 of the elastic members 40 are accommodated in the second recesses 22 of the lower base member 21. At the same time, the lower contact arms 53 of the respective contacts 50 are accommodated in the plurality of the second slits 24 of the lower base member 21. At this time, the plurality of the contacts 50 are stably aligned on and held by the elastic members 40, so that the lower contact arms 53 thereof can be readily accommodated in the corresponding second slits 24.

Succeedingly, the upper base member 11 is arranged on the units so that the upper contact arms 51 of the respective contacts 50 are accommodated in the plurality of the first slits 14 of the upper base member 11. At this time, since the plurality of the contacts 50 are stably aligned on and held by the elastic members 40, the upper contact arms 51 thereof can be readily accommodated in the corresponding first slits 14. Also, the upper portions 41 of the elastic members 40 are accommodated in the first recesses 16 of the upper base member 11.

Assembly of the base member 10 is completed by mounting of the upper base member 11 and the elastic members 40 are interposed vertically by the upper base member 11 and the lower base member 21 as shown in FIG. 6, so that the contacts 50 held by the elastic members 40 are surely held in a correct posture in predetermined positions on the base member 10. In this manner, the matter that the base member including the plurality of the elastic members 40 and the plurality of the contacts 50 can be readily assembled means that the base member can be readily decomposed. Accordingly, in the case where a contact is deteriorated, the work of exchanging the contact is simply performed.

Subsequently, an explanation will be given to the elastic members 40. The elastic members 40 are formed from an electrically insulating and flexible, synthetic resin. The elastic members 40 are ones, which hold the contacts 50. Also, the elastic members 40 are also ones, which control contact pressures of the upper contact portions 51a and the lower contact portions 53a of the contacts 50 to external contacts of the semiconductor device 80 and the circuit board 90.

The elastic members 40 comprise the plate-shaped upper portion 41 having the length $L_{41}$ and the width $W_{41}$ and the plate-shaped lower portion 42 having the length $L_{42}$ and the width $W_{42}$. The length $L_{41}$ of the upper portion 41 is represented as a distance between a front side surface 41a and a rear side surface 41b thereof and the length $L_{42}$ of the lower portion 42 is represented as a distance between a front side surface 42a and a rear side surface 42b thereof. The width $W_{41}$ of the upper portion and the width $W_{42}$ of the lower portion are equal to each other. As shown in FIG. 4, the upper portion 41 and the lower portion 42 of the elastic member 40 are shaped stepwise to overlap vertically in a state of deviating from each other in a back and forth direction and formed substantially integrally. Here, assuming that $L_{40}$ indicates a length of the elastic members 40, the relationship of $L_{41}$ (or $L_{42}$)<$L_{40}$<$L_{41}$+$L_{42}$ exists, and assuming that $W_{40}$ indicates a width of the elastic members 40, the relationship $W_{40}$=$W_{41}$=$W_{42}$ exists. Also, the elastic members 40 are set with respect to respective lengths so as to maintain the relationships of $L_{14}$<$L_{41}$<$L_{16}$ and $L_{24}$<$L_{42}$<$L_{22}$.

The elastic members 40 are preferably formed so that when the elastic members 40 are assembled into the base member 10, the front side surfaces 41a of the upper portions 41 thereof come into contact with the front side surfaces 16a of the first recesses 16 of the upper base member 11. Likewise, the elastic members 40 are preferably formed so that the rear side surfaces 42b of the lower portions 42 thereof come into contact with the rear side surfaces 22b of the second recesses 22 of the lower base member 21. Thereby, first space portions 18 and second space portions 28 are defined between the elastic members 40 and the upper base member 11 and the lower base member 21, respectively, when the elastic members 40 are assembled into the base member 10 (see FIG. 6).

Fourth slits 44 are formed in a region, in which the upper portion 41 and the lower portion 42 of the elastic member 40 overlap each other. The fourth slits 44 are formed to fundamentally comprise an upper opening portion 44a, a lower opening portion 44c, and a vertical portion 44b extending vertically between the upper opening portion 44a and the lower opening portion 44c. In the embodiment, a front side surface 44f of the vertical portion 44b of the fourth slit 44 is inclined upwardly forward on the upper portion 41 to form a first inclined surface 44d extending to the upper opening portion 44a. Owing to the provision of the fourth slits 44, the elastic members 40 can hold the contacts 50 while correcting the contacts 50 in a correct posture.

Also, a rear side surface 44g of the vertical portion 44b of the fourth slit 44 is inclined downwardly rearward at the lower portion 42 to form a second inclined surface 44e extending to the lower opening portion 44c. Owing to the provision of the inclined surfaces 44d, 44e on the fourth slit 44, it is made possible to adjust sliding magnitudes (wiping magnitudes) of the upper contact portion 51a and the lower contact portion 53a of the contact 50 as described later. Also, it is made possible to minutely adjust sliding magnitudes (wiping magnitudes) depending upon inclinations of the inclined surfaces 44d, 44e. Further, the provision of the inclined surfaces 44d, 44e makes it possible to reduce damage to the semiconductor device 80. As described later, this is aimed at turning the contact 50 from an initial stage, in which the semiconductor device 80 is pushed down, to gradually exert a load on the semiconductor device 80 with a magnitude, by which the semiconductor device 80 is pushed down. In the case where the inclined surfaces 44d, 44e are not provided, there is a fear that a magnitude, by which the semiconductor device 80 is pushed down until the contact 50 turns, is large and when a predetermined magnitude of pushing-down is reached, a load by the contact 50 rapidly acts on the semiconductor device 80 to damage the semiconductor device 80. Subsequently, after a predetermined magnitude of pushing down the semiconductor device 80 is reached, when the semiconductor device 80 is pushed down by the same magnitude in the case where the inclined surfaces 44d, 44e are provided and in the case where the inclined surfaces 44d, 44e are not provided, a load acting on the semiconductor device 80 is smaller in case of the provision of the inclined surfaces 44d, 44e than in case of non-provision. Owing to the provision of the inclined surfaces 44d, 44e, the range of a magnitude of pushing-down of the semiconductor device 80, in which an appropriate contact force between the semiconductor device 80 and the contact 50 is obtained, is widened. It is possible to expect effects of enabling relaxing dimensional setting related to magnitudes, by which the lock member 60 and the push member 70 are pushed down, simplifying setting of a magnitude of pushing-down of a handler device in the case where the handler device is used to push down the semiconductor device 80, and so on. In addition, the same effects as those described above are also produced in the case where either of the inclined surfaces 44d, 44e is provided as described later. However, it is thought that an effect as produced is great in the case where both the inclined surfaces 44d, 44e are provided.

Also, the fourth slits 44 are preferably formed so that front side surfaces 44f thereof mate with the front side surfaces 24a of the second slits 24 of the lower base member 21 when the elastic members 40 are assembled into the base member 10. Likewise, the fourth slits 44 are preferably formed so that rear side surfaces 44g thereof mate with the rear side surfaces 14b of the first slits 14 of the upper base member 11.

A longitudinal length $L_{44}$ of the vertical portions 44b of the fourth slits 44 is substantially equal to a longitudinal length $L_{52}$ of holding portions 52 of the contacts 50. Also, a vertical length of the vertical portions 44b of the fourth slits 44 is equal to a height $H_{40}$ of the elastic member 40.

In addition, the height $H_{40}$ of the elastic member 40 is substantially equal to a height obtained by adding the height $H_{22}$ of the second recesses 22 of the lower base member 21 to the height $H_{16}$ of the first recesses 16 of the upper base member 11 ($H_{40}=H_{41}+H_{42}=H_{16}+H_{22}$).

Finally, an explanation will be given to the contacts 50.

The respective contacts 50 are ones for electrically connecting between the semiconductor device 80 and the circuit board 90. In the embodiment, in particular, in order to accommodate for communication of high frequency signals, the contacts 50 are formed as substantially rigid bodies and formed to make a signal line length short.

FIG. 5 shows the structure of the respective contacts 50 in the embodiment. The contact 50 includes the upper contact arm 51, the holding portion 52, and the lower contact arm 53 and is substantially Z-shaped as viewed laterally. The upper contact arm 51 is positioned before the vertical holding portion 52 to extend inclining upwardly forward from an upper end of the holding portion 52. The lower contact arm 53 is positioned behind the holding portion 52 to extend inclining a little downwardly rearward from a lower end of the holding portion 52. An upper end (an upper tip end) of the upper contact arm 51 makes the upper contact portion 51a to contact with an external contact (not shown) of the semiconductor device 80 and a lower end (a lower tip end) of the lower contact arm 53 makes the lower contact portion 53a to contact with an external contact (not shown) of the circuit board 90. The upper contact arm 51 and the lower contact arm 53 are preferably structured so that the contact 50 itself is arranged to enable turning whereby the upper contact portion 51a and the lower contact portion 53a thereof can be displaced a little up and down.

Also, the substantially vertical holding portion 52 of the contact 50 is arranged in the vertical portion 44b of the fourth slit 44 provided in the elastic member 40 to be held by the vertical portion 44b. Further, a first projection 51b as an elastic-member abutting portion, which abuts against an upper surface of the upper portion 41 of the elastic member 40, can be formed at a front end of the upper contact arm 51 to protrude downward. Likewise, a second projection 53b as elastic-member abutting portion, which abuts against a lower surface of the lower portion 42 of the elastic member 40, can be formed at a rear end of the lower contact arm 53. Contact pressure between the upper contact portion 51a and an external contact of the semiconductor device 80 can be adjusted, as described later, depending upon the presence of the first projection 51b or a magnitude ($h_1$) of projection. Likewise, contact pressure between the lower contact portion 53a and an external contact of the circuit board 90 can be adjusted depending upon the presence of the second projection 53b or a magnitude ($h_2$) of projection. In addition, formation of the first and second projections 51b, 53b is not limited to the embodiment but, for example, the first projection 51b may be formed to protrude inclining downwardly forward and the second projection 53b may be formed to protrude inclining upwardly rearward.

$L_{50}$ indicates a posterior-anterior length of the contacts 50, $H_{50}$ indicates a vertical length (height), and t indicates a width (thickness) of the contacts 50. Also, $L_{51}$ indicates a posterior-anterior length of the upper contact arm 51, $L_{52}$ indicates a posterior-anterior length of the holding portion 52, and $L_{53}$ indicates a posterior-anterior length of the lower contact arm 53.

In the embodiment, the contacts 50 are set in size so as to maintain the relationships of $L_{50}<L_{40}$, $H_{50}>H_{11}+H_{21}$, $t \cong H_{14}$. Further, the contacts 50 are set so as to maintain the relationships of $L_{51}<L_{14}$, $L_{52} \cong L_{44}$, $L_{53}<L_{24}$, $L_{51}-L_{52}<$(a distance to the front side surfaces of the second slits 24 from the front side surface 22 of the second recess).

In addition, a signal line length of the contacts 50 in the embodiment amounts substantially to $L_{51}H_{50}$.

Contacts 150, 250 shown in FIGS. 7 and 8 constitute modifications of the contacts 50.

Specifically, a vertical holding portion 152 is provided on the contact 150 in a second embodiment but shorter than that in the first embodiment and an upper contact arm 151 is smaller in inclination than that in the first embodiment. In the second embodiment, a contact projection 154 is provided below a lower contact arm 153 of the contact 150. Here, it goes without saying that a lower end of the contact projection 154 makes a lower contact portion 154a of the contact 150, which comes into contact with an external contact of the circuit board 90. The contact projection 154 in the embodiment is formed in the vicinity of and a little rearwardly of a location, in which the holding portion 152 and the lower contact arm 153 intersect each other, to extend downward from the lower contact arm 153. In this case, a lower portion of the second slit 24 of the lower base member 21, in which the lower contact arm 153 of the contact 150 is arranged, is preferably formed as a small, vertical through-hole 26 corresponding to a size of the contact projection 154 of the contact 150. Alternatively, the second slits 24 may be formed into a single fourth recess and only a plurality of vertical through-holes 26 may be formed in predetermined positions along a rear side surface of the fourth recess so as to extend toward a lower surface 21b of a lower base member from a bottom surface of the fourth recess. The vertical through-holes 26 are preferably formed to be a little larger than a posterior-anterior length of the contact projections 154 so that the contact projections 154 can move back and forth in the vertical through-holes 26. Of course, it is to be understood that in the case where the contact projections 154 are not formed on the contacts 150, the second slits 24 of the lower base member 21 suffice to be the same as those in the first embodiment.

A third embodiment is constructed as shown in FIG. 8 that the vertical holding portion 52 in the first embodiment is omitted from a contact 250 and an upper contact arm 251 directly extends inclining forwardly upward from a front portion of a lower contact arm 253. In the third embodiment, a contact projection 254 is also formed to be directed downward from the lower contact arm 253. In the embodiment, the contact projection 254 is formed in a location, in which the upper contact arm 251 and the lower contact arm 253 intersect each other, to extend downward from the lower contact arm 253. The embodiment is the same as the second embodiment in that a lower end of the contact projection 254 makes a lower contact portion 254a of the contact 250, which comes into contact with an external contact of the circuit board 90. It suffices that the structure of the second slits 24 of the lower base member 21 in the embodiment be modified in the same manner as described in the second embodiment.

Referring to FIGS. 9 to 17, an explanation will be given below to how adjustment of contact pressure between a contact of the invention and external contacts of a semiconductor device or a circuit board and a sliding magnitude of the contact relative to the external contacts are materialized in the invention. In addition, the explanation herein is given with the use of the first embodiment and since the second and third embodiments are the same as the first embodiment, an explanation therefor is omitted.

FIGS. 9 to 11 show a method of adjusting a contact pressure of the contact 50 on the semiconductor device 80 as a contacted article.

Figure 9C:
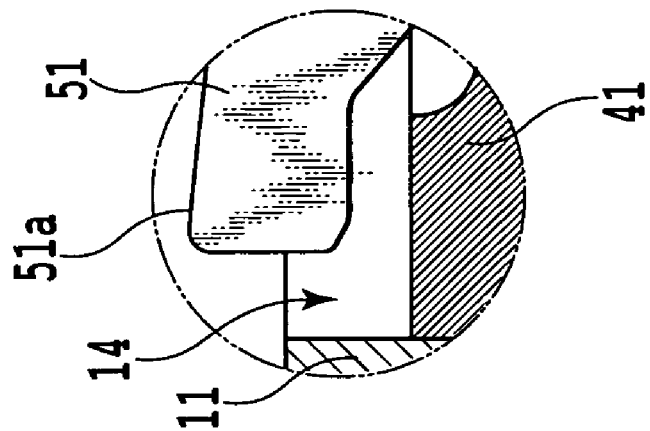
FIG. 9C is a diagram to illustrate an embodiment, in which a contact pressure between a contacted article and a contact is adjusted, and showing the case of an upper contact arm of a contact having a different shape from those in FIG. 9A and FIG. 9B.
Figure 9B:
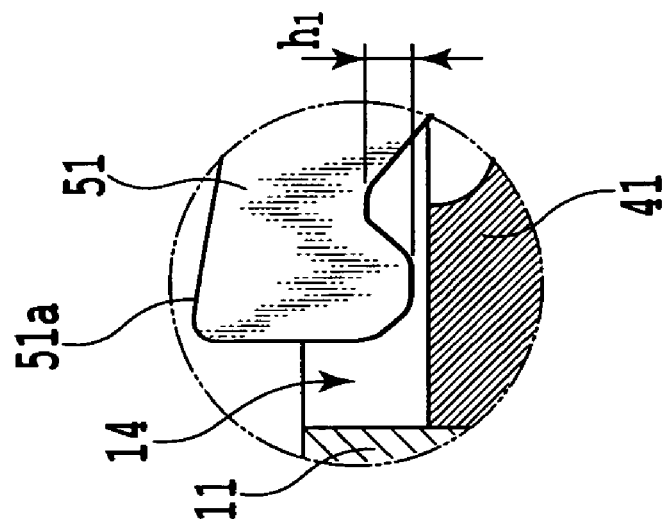
FIG. 9B is a diagram to illustrate an embodiment, in which a contact pressure between a contacted article and a contact is adjusted, and showing the case of an upper contact arm of a contact having a different shape from that in FIG. 9A.
Figure 9A:
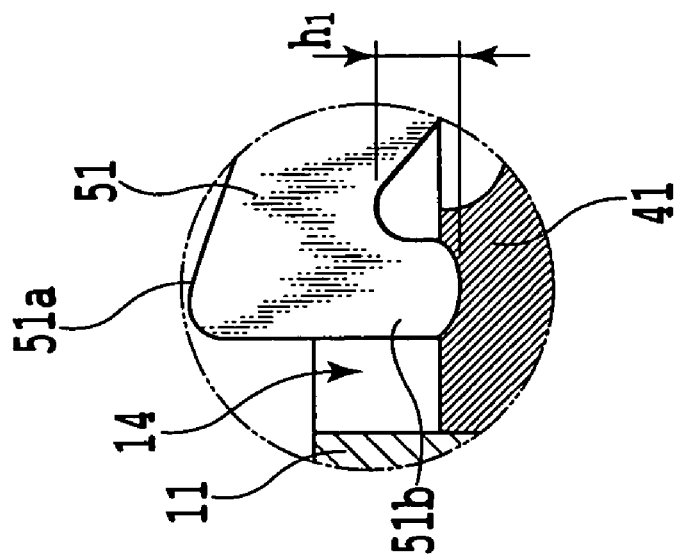
FIG. 9A is a diagram to illustrate an embodiment, in which a contact pressure between a contacted article and a contact is adjusted, and showing a method of adjusting the contact pressure by means of changing a shape of an upper contact arm of the contact.

FIG. 9 shows a method of adjusting a contact pressure by means of changing a shape of the contact 50, more specifically, a magnitude $h_1$ of projection of the first projection 51b of the upper contact arm 51 of the contact 50. The magnitude $h_1$ of projection of the first projection 51b is decreased as it goes from FIG. 9A to 9C.

When the semiconductor device (not shown) is pushed down from above, the first projection 51b abuts against the upper surface of the elastic member 40 to deform the same. At this time, the larger the magnitude $h_1$ of projection of the first projection 51b, the larger deformation of the elastic member 40, whereby a reaction force on the first projection 51b from the elastic member 40 increases. Accordingly, the larger the magnitude $h_1$ of projection of the first projection 51b, the larger a contact pressure of the upper contact portion 51a on an external contact (not shown) of the semiconductor device 80. It is understood from this that a contact pressure can be readily adjusted by means of changing the magnitude $h_1$ of projection of the first projection 51b of the upper contact arm 51 of the contact 50.

Figure 10A:
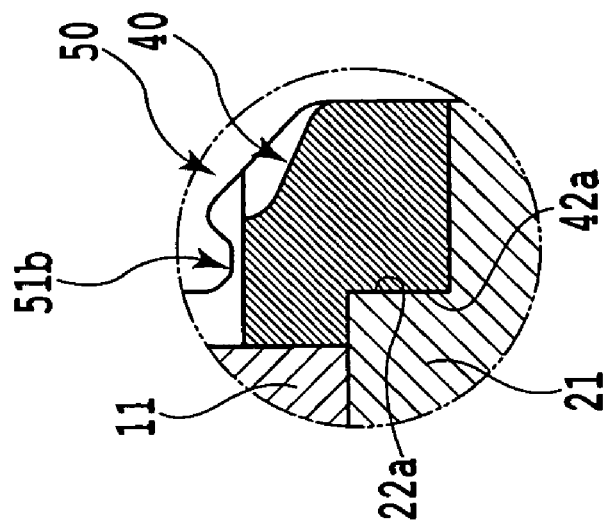
FIG. 10A is a diagram to illustrate other embodiment, in which a contact pressure between a contacted article and a contact is adjusted, and showing a method of adjusting the contact pressure by means of changing a shape of a lower portion of an elastic member.
Figure 10B:
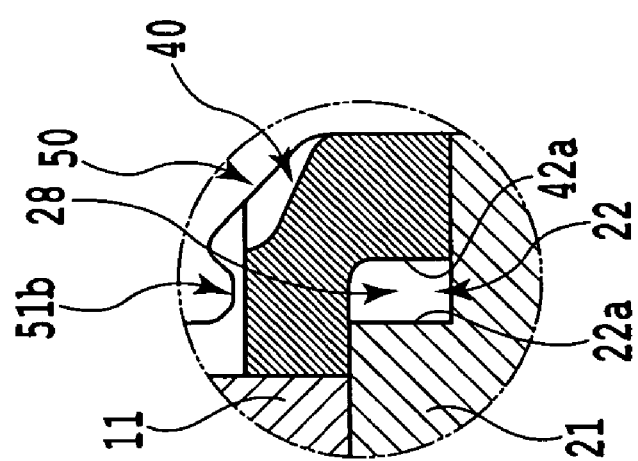
FIG. 10B is a diagram to illustrate other embodiment, in which a contact pressure between a contacted article and a contact is adjusted, and showing the case of a lower portion of an elastic member having a different shape from that in FIG. 10A.
Figure 10C:
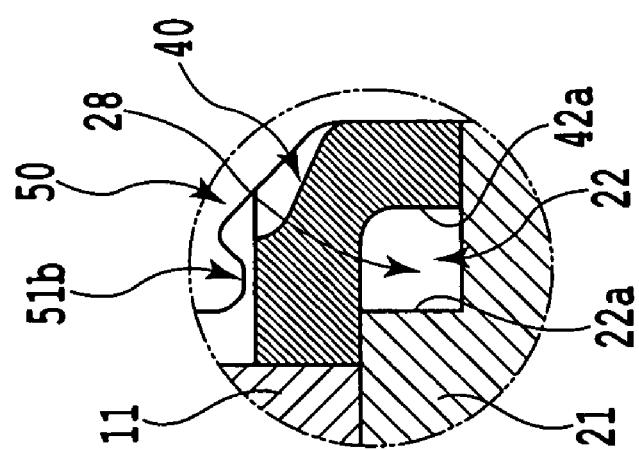
FIG. 10C is a diagram to illustrate other embodiment, in which a contact pressure between a contacted article and a contact is adjusted, and showing the case of a lower portion of an elastic member having a different shape from those in FIG. 10A and FIG. 10B.

FIG. 10 shows a method of adjusting a contact pressure by means of changing a shape of the elastic member 40, more specifically, a shape of the lower portion 42 of the elastic member 40. As it goes from FIG. 10A to FIG. 10C, a region which the lower portion 42 of the elastic member 40 is accommodated and filled into the second recess 22 of the lower base member 21, is decreased. That is, the front side surface 42a of the lower portion 42 of the elastic member 40 approaches the front side surface 22a of the second recess 22 of the lower base member 21 to decrease a size of the second space portion 28 defined by the elastic member 40 and the base member 10.

When the semiconductor device (not shown) is pushed down from above, the first projection 51b abuts against the upper surface of the elastic member 40 to deform the same. At this time, as the space portion 28 is made large in size, the space portion 28 absorbs deformation of the elastic member 40 whereby a reaction force on the first projection 51b from the elastic member 40 decreases. Accordingly, the larger a size of the space portion 28, the smaller a contact pressure of the upper contact portion 51a on an external contact of the semiconductor device. It is understood from this that a contact pressure can be readily adjusted by means of changing a size of the space portion 28 defined by the elastic member 40 and the base member 10. In addition, in case of adjusting a size of the space portion 28, the approaching method is not limited to above. A lower surface of the upper portion 41 of the elastic member 40 may approach the bottom surface 22e of the second recess 22 of the lower base member 21. Also, the approaching method may be obtained by combining these approaching methods described above.

Figure 11B:
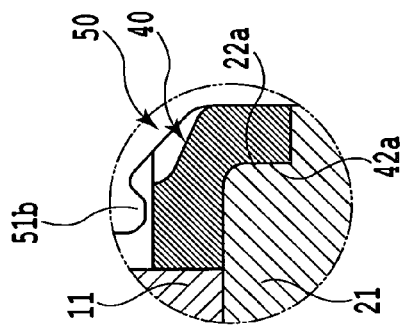
FIG. 11B is a diagram to illustrate further embodiment, in which a contact pressure between a contacted article and a contact is adjusted, and showing the case of a lower base member having a different shape from that in FIG. 11A.
Figure 11A:
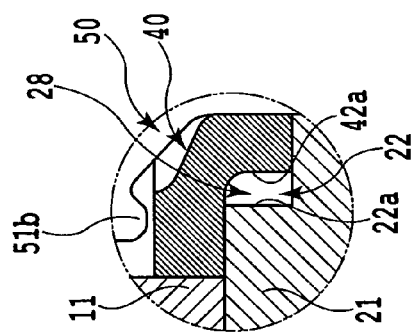
FIG. 11A is a diagram to illustrate further embodiment, in which a contact pressure between a contacted article and a contact is adjusted, and showing a method of adjusting the contact pressure by means of changing a shape of a lower base member, which forms a base member.
Figure 11C:
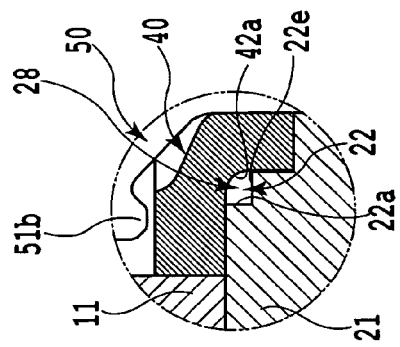
FIG. 11C is a diagram to illustrate further embodiment, in which a contact pressure between a contacted article and a contact is adjusted, and showing the case of a lower base member having a different shape from those in FIG. 11A, FIG. 11B, and FIG. 11D.
Figure 11D:
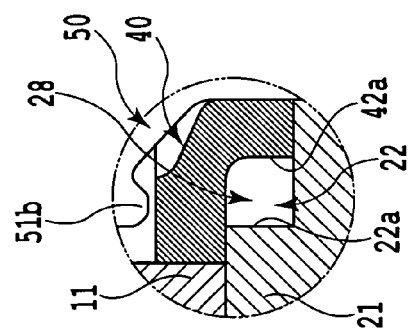
FIG. 11D is a diagram to illustrate further embodiment, in which a contact pressure between a contacted article and a contact is adjusted, and showing the case of a lower base member having a shape resulted from deformation of FIG. 11B.

FIGS. 11A to 11C show a method of adjusting a contact pressure by means of changing a shape of the base member 10, more specifically, a shape of the lower base member 21 of the base member 10. The method uses substantially the same principle as that in the method shown in FIGS. 10A to 10C. That is, a contact pressure is adjusted by means of changing a size of the space portion 28 defined by the elastic member 40 and the base member 10. That is, the front side surface 22a of the second recess 22 of the lower base member 21 approaches the front side surface 42a of the lower portion 42 of the elastic member 40 to decrease a size of the second space portion 28 defined by the elastic member 40 and the base member 10. In addition, since the operation of adjusting a contact pressure is the same as that in FIG. 10A to 10C, it is omitted. Also, in case of adjusting a size of the space portion 28, the approaching method is not limited to above. The bottom surface 22e of the second recess 22 of the lower base member 21 may approach a lower surface of the upper portion 41 of the elastic member 40. Also, the approaching method (see FIG. 11D) may be obtained by combining these approaching methods described above.

Subsequently, FIGS. 12A to 14D show a method of adjusting a contact pressure of the contact 50 on the circuit board 90 as a contacted article.

Figure 12C:
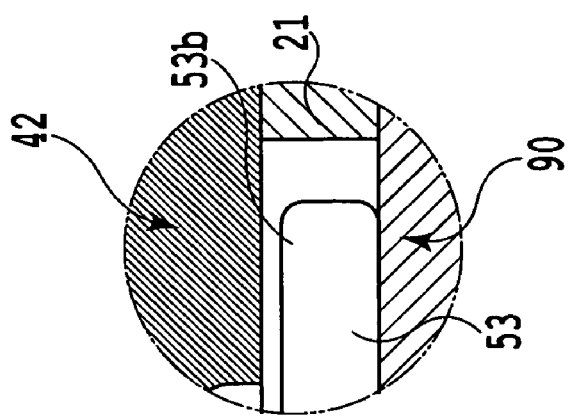
FIG. 12C is a diagram to illustrate an embodiment, in which a contact pressure between a contacted article and a contact is adjusted, and showing the case of a lower contact arm of a contact having a different shape from those in FIG. 12A and FIG. 12B.
Figure 12B:
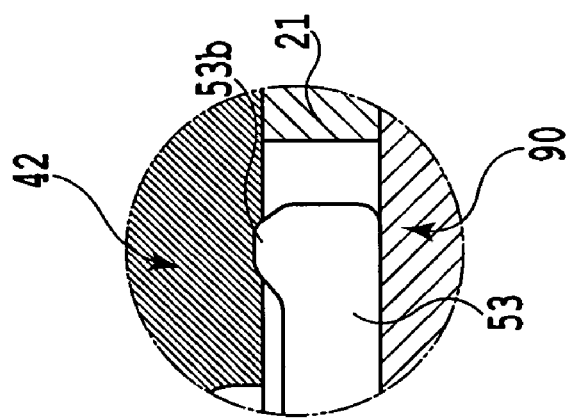
FIG. 12B is a diagram to illustrate an embodiment, in which a contact pressure between a contacted article and a contact is adjusted, and showing the case of a lower contact arm of a contact having a different shape from that in FIG. 12A.
Figure 12A:
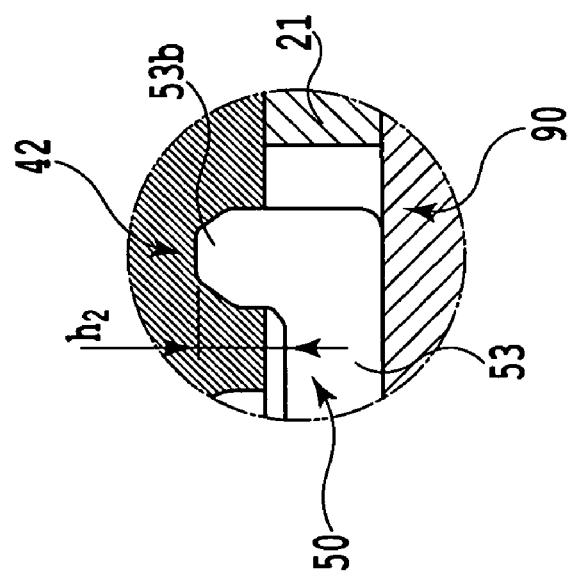
FIG. 12A is a diagram to illustrate an embodiment, in which a contact pressure between a contacted article and a contact is adjusted, and showing a method of adjusting the contact pressure by means of changing a shape of a lower contact arm of a contact.

FIGS. 12A to 12C show a method of adjusting a contact pressure by means of changing a shape of the contact 50, more specifically, a magnitude $h_2$ of projection of the second projection 53b of the lower contact arms 53 of the contacts 50. The magnitude $h_2$ of projection of the second projection 53b is decreased as it goes from FIG. 12A to 12C.

When the electrical connecting device 1 is mounted to the circuit board 90, the second projection 53b abuts against the lower surface of the elastic member 40 to deform the same. At this time, the larger a magnitude $h_2$ of projection of the second projection 53b, the larger deformation of the elastic member 40, whereby a reaction force on the second projection 53b from the elastic member 40 increases. Accordingly, the larger the magnitude $h_2$ of projection of the second projection 53b, the larger a contact pressure of the lower contact portion 53a on an external contact of the circuit board 90. It is understood from this that a contact pressure can be readily adjusted by means of changing the magnitude $h_2$ of projection of the second projection 53b of the lower contact arms 53 of the contacts 50.

Figure 13C:
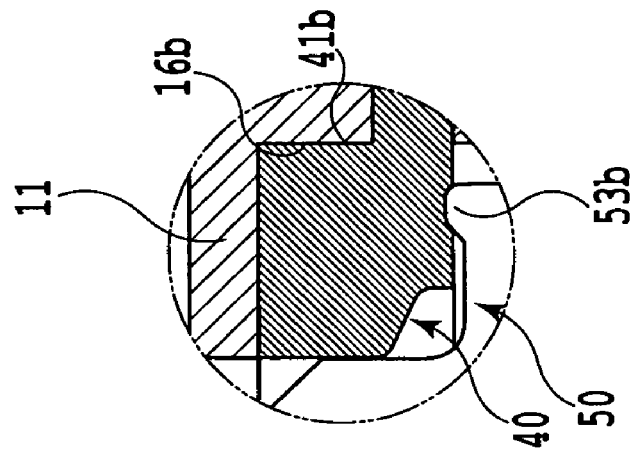
FIG. 13C is a diagram to illustrate other embodiment, in which a contact pressure between a contacted article and a contact is adjusted, and showing the case of an upper portion of an elastic member having a different shape from those in FIG. 13A and FIG. 13B.
Figure 13B:
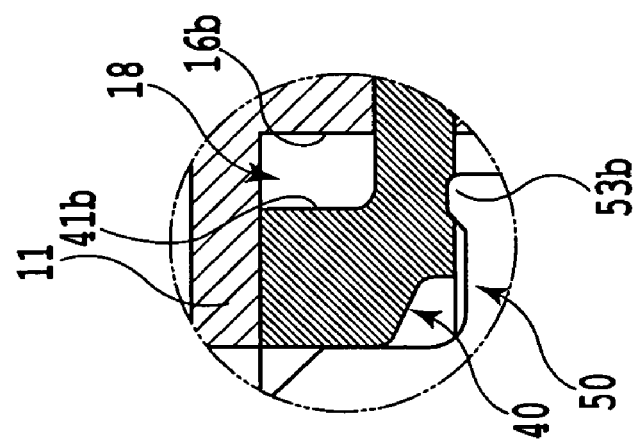
FIG. 13B is a diagram to illustrate other embodiment, in which a contact pressure between a contacted article and a contact is adjusted, and showing the case of an upper portion of an elastic member having a different shape from that in FIG. 13A.
Figure 13A:
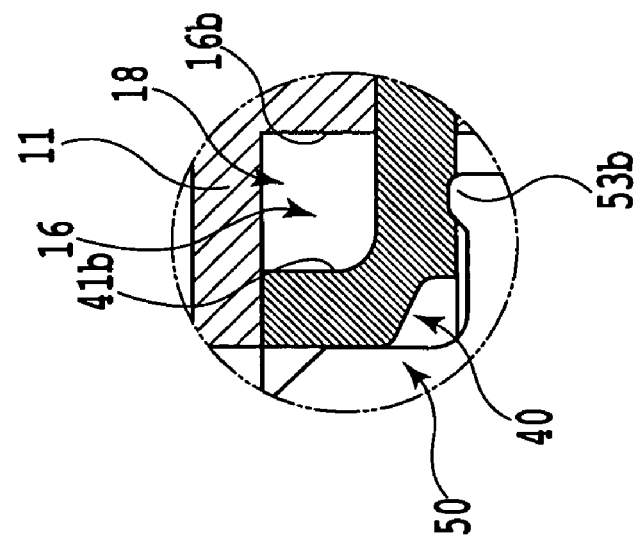
FIG. 13A is a diagram to illustrate other embodiment, in which a contact pressure between a contacted article and a contact is adjusted, and showing a method of adjusting the contact pressure by means of changing a shape of an upper portion of an elastic member.

FIGS. 13A to 13C show a method of adjusting a contact pressure by means of changing a shape of the elastic member 40, more specifically, a shape of the upper portion 41 of the elastic member 40. As it goes from FIG. 13A to FIG. 13C, a region which the upper portion 41 of the elastic member 40 is accommodated and filled into the first recess 16 of the upper base member 11, is decreased. That is, the rear side surface 41b of the upper portion 41 of the elastic member 40 approaches the rear side surface 16b of the first recess 16 of the upper base member 11 to decrease a size of the first space portion 18 defined by the elastic member 40 and the base member 10.

When the electrical connecting device 1 is mounted to the circuit board 90, the second projection 53b abuts against the lower surface of the elastic member 40 to deform the same. At this time, as the space portion 18 is made large in size, the space portion 18 absorbs deformation of the elastic member 40 whereby a reaction force on the second projection 53b from the elastic member 40 decreases. Accordingly, the larger a size of the space portion 18, the smaller a contact pressure of the lower contact portion 53a on an external contact of the circuit board 90. It is understood from this that a contact pressure can be readily adjusted by means of changing a size of the space portion 18 defined by the elastic member 40 and the base member 10. In addition, in case of adjusting a size of the space portion 18, the approaching method is not limited to above. An upper surface of the lower portion 42 of the elastic member 40 may approach the bottom surface of the first recess 16 of the upper base member 11. Also, the approaching method may be obtained by combining these approaching methods described above.

Figure 14A:
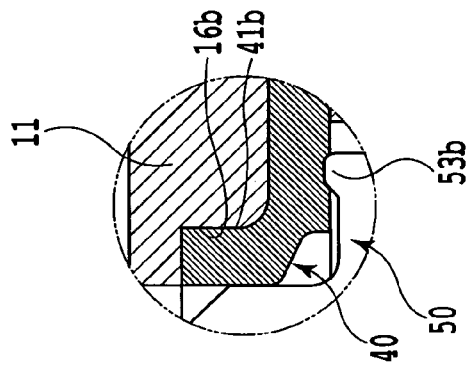
FIG. 14A is a diagram to illustrate further embodiment, in which a contact pressure between a contacted article and a contact is adjusted, and showing a method of adjusting the contact pressure by means of changing a shape of an upper base member, which forms a base member.
Figure 14B:
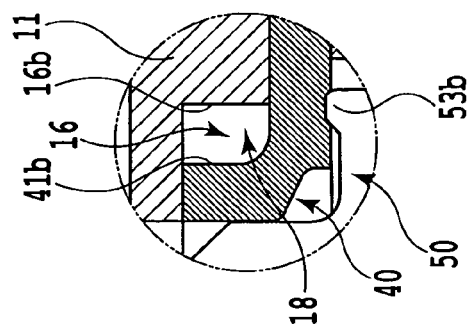
FIG. 14B is a diagram to illustrate further embodiment, in which a contact pressure between a contacted article and a contact is adjusted, and showing the case of an upper base member, which forms a base member and has a different shape from that in FIG. 14A.
Figure 14D:
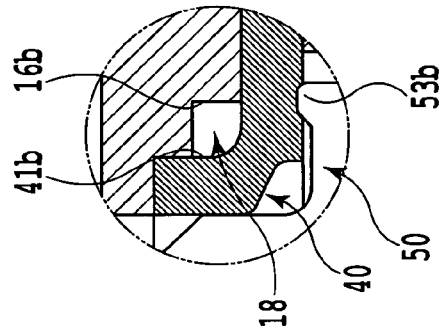
FIG. 14D is a diagram to illustrate further embodiment, in which a contact pressure between a contacted article and a contact is adjusted, and showing the case of an upper base member, which forms a base member and has a shape resulted from deformation of FIG. 14B.
Figure 14C:
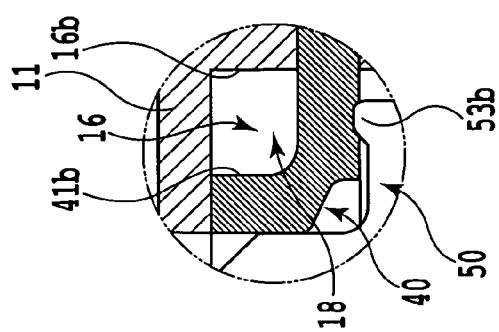
FIG. 14C is a diagram to illustrate further embodiment, in which a contact pressure between a contacted article and a contact is adjusted, and showing the case of an upper base member, which forms a base member and has a different shape from those in FIG. 14A, FIG. 14B and FIG. 14D.

FIGS. 14A to 14C show a method of adjusting a contact pressure by means of changing a shape of the base member 10, more specifically, a shape of the upper base member 11 of the base member 10. The method uses substantially the same principle as that in the method shown in FIGS. 13A to 13C. That is, a contact pressure is adjusted by changing a size of the space portion 18 defined by the base member 10 and the elastic member 40. That is, the rear side surface 16b of the first recess 16 of the upper base member 11 approaches the rear side surface 41b of the upper portion 41 of the elastic member 40 to decrease a size of the second space portion 18 defined by the elastic member 40 and the base member 10. In addition, since the operation of adjusting a contact pressure is the same as that in FIG. 13A to 13C, it is omitted. Also, in case of adjusting a size of the space portion 18, the approaching method is not limited to above. A bottom surface of the first recess 16 of the upper base member 11 may approach an upper surface of the lower portion 42 of the elastic member 40. Also, the approaching method (see FIG. 14D) may be obtained by combining these approaching methods described above.

Subsequently, FIGS. 15 to 17 show a method of adjusting a sliding magnitude (wiping magnitude) of the contact 50 relative to the semiconductor device 80 and the circuit board 90 as contacted articles. More specifically, FIGS. 15 to 17 show a method of adjusting back and forth movements of the upper contact portion 51a and the lower contact portion 53a of the contact 50 relative to the semiconductor device 80 and the circuit board 90. In the embodiment, movements of the contact 50 can be adjusted by changing a shape of the elastic member 40, more specifically, a shape of the slit 44 of the elastic member 40.

FIG. 15 shows the electrical connecting device 1 having a shape of the slits 44 of the elastic member 40 illustrated in the first embodiment shown in FIGS. 1 to 6. FIG. 15 shows a state, in which the electrical connecting device 1 is mounted to the circuit board 90 and the semiconductor device 80 is mounted to the electrical connecting device 1.

In the case shown in FIG. 15, the upper contact arm 51 of the contact 50 is pushed down by the semiconductor device 80 to turn counter-clockwise to wipe an external contact of the semiconductor device 80. On the other hand, the lower contact arms 53 of the contacts 50 is pushed up by the circuit board 90 to turn counter-clockwise likewise to wipe an external contact of the circuit board 90.

FIG. 16 shows the elastic member 40 shaped such that the first inclined surface 44d formed on the upper portion 41 and the second inclined surface 44e formed on the lower portion 42 are moved upward substantially in parallel, relating to the slit 44 of the elastic member 40. In other words, the first inclined surface 44d is omitted from the slit 44 of the elastic member 40 and the portion, in which the first inclined surface 44d is omitted, is composed of only the vertical, front side surface 44f. The second inclined surface 44e is formed to be positioned within the upper portion 41 of the elastic member 40.

In the case shown in FIG. 16, when the semiconductor device 80 is pushed down, the upper contact arm 51 of the contact 50 turns counter-clockwise in the same manner as that the case shown in FIG. 15. However, the first inclined surface 44d of the elastic member 40 ascends to be omitted and the elastic member 40 is present instead, whereby turning of the contact is restricted. Accordingly, a magnitude, by which an external contact of the semiconductor device 80 is wiped, is decreased. On the other hand, the lower contact arms 53 of the contacts is pushed up by the circuit board 90 to turn counter-clockwise likewise. At this time, since the second inclined surface 44e of the elastic member 40 ascends to be positioned highly and the elastic member 40 is not present, turning of the lower contact arms 53 of the contacts 50 increases and a magnitude, by which an external contact of the circuit board 90 is wiped, is increased.

FIG. 17 shows, in contrast with FIG. 16, the elastic member 40 shaped such that the first inclined surface 44d formed on the upper portion 41 and the second inclined surface 44e formed on the lower portion 42 are moved downward substantially in parallel, relating to the slit 44 of the elastic member 40. In other words, the slit 44 of the elastic member 40 is formed so that the first inclined surface 44d is positioned on the lower portion 42. The second inclined surface 44e is omitted, the portion, in which the second inclined surface 44e is omitted, is composed of only the vertical rear side surface 44g.

Also, in the case shown in FIG. 17, when the semiconductor device 80 is pushed down, the upper contact arm 51 of the contact 50 turns counter-clockwise in the same manner as that the case shown in FIG. 15. However, the first inclined surface 44e of the elastic member 40 descends to be positioned lowly and the elastic member 40 is not present, so that turning of the contact is increased. Accordingly, a magnitude, by which an external contact of the semiconductor device 80 is wiped, is increased. On the other hand, the lower contact arms 53 of the contacts 50 is pushed down by the circuit board 90 to turn counter-clockwise likewise. At this time, the second inclined surface 44e of the elastic member 40 descends to be omitted and the elastic member 40 is present, so that turning of the lower contact arms 53 is restricted whereby a magnitude, by which an external contact of the circuit board 90 is wiped, is decreased.

It is understood from the above matter that a sliding magnitude of the contact can be readily adjusted by changing a shape of the slit 44 of the elastic member 40.

While the present invention has been described with reference to exemplary embodiments, it is to be understood that the invention is not limited to the disclosed exemplary embodiments. The scope of the following claims is to be accorded with the broadest interpretation so as to encompass all such modifications and equivalent structures and functions.

What is claimed is:

1. An electrical connecting device for electrically connecting between two contacted articles, that is, a first contacted article and a second contacted article, comprising:
   a base member, to which the first contacted article and the second contacted article are mounted, an elastic member held on the base member, and a plurality of contacts held on the elastic member,
   wherein the base member includes an upper base member and a lower base member, each including an accommodating recess, which accommodates the elastic member, the elastic member includes slits, respectively, extending through the elastic member and holding the plurality of contacts, the plurality of contacts, respectively, include at least an upper contact arm having an upper contact portion capable of contacting with the first contacted article and a lower contact arm having a lower contact portion capable of contacting with the second contacted article, and the upper contact arm and the lower contact arm of each of the plurality of contacts are structured to enable abutting against the elastic member, wherein a first space portion is provided to rearward of a first recess of the upper base member as the accommodating recess, which accommodates an upper portion of the elastic member, and a second space portion is provided in front of a second recess of the lower base member as the accommodating recess, which accommodates a lower portion of the elastic member, and wherein magnitudes, by which the elastic member is pushed by the contacts, respectively, can be adjusted by the presence of the first and second space portions, respectively, and by changing respective sizes of the first and second space portions.

2. The electrical connecting device according to claim 1, wherein a second projection is provided at a tip end of the lower contact arm of the contact to abut against the elastic member to push the same, and wherein the magnitude of the second projection determines the respective magnitudes by which the elastic member is pushed.

3. An electrical connecting device for electrically connecting between two contacted articles, that is, a first contacted article and a second contacted article, comprising:

a base member, to which the first contacted article and the second contacted article are mounted, an elastic member held on the base member, and a plurality of contacts held on the elastic member, wherein the base member includes an upper base member and a lower base member, each including an accommodating recess, which accommodates the elastic member, the elastic member includes slits, respectively, extending through the elastic member and holding the plurality of contacts, the plurality of contacts, respectively, include at least an upper contact arm having an upper contact portion capable of contacting with the first contacted article and a lower contact arm having a lower contact portion capable of contacting with the second contacted article, and the upper contact arm and the lower contact arm of each of the plurality of contacts are structured to enable abutting against the elastic member, wherein back and forth movements of the upper contact portion of the upper contact arm of the contact and the lower contact portion of the lower contact arm can be adjusted by changing the slits of the elastic member in shape, wherein the slit of the elastic member is defined by an upper opening portion, a lower opening portion, and a vertical portion extending vertically between the upper opening portion and the lower opening portion, and a front side surface of the vertical portion includes a first inclined surface inclined upwardly forward and a rear side surface of the vertical portion includes a second inclined surface inclined downwardly rearward.

4. The electrical connecting device according to claim 3, wherein a first projection is provided at a tip end of the upper contact arm of the contact to abut against the elastic member to push the same, and wherein the magnitude of the first projection determines the respective magnitudes by which the elastic member is pushed.

5. An electrical connecting device for electrically connecting between two contacted articles, that is, a first contacted article and a second contacted article, comprising:

a base member, to which the first contacted article and the second contacted article are mounted, an elastic member held on the base member, and a plurality of contacts held on the elastic member, wherein the base member includes an upper base member and a lower base member, each including an accommodating recess, which accommodates the elastic member.

the elastic member includes slits, respectively, extending through the elastic member and holding the plurality of contacts, the plurality of contacts, respectively, include at least an upper contact arm having an upper contact portion capable of contacting with the first contacted article and a lower contact arm having a lower contact portion capable of contacting with the second contacted article, and the upper contact arm and the lower contact arm of each of the plurality of contacts are structured to enable abutting against the elastic member, wherein back and forth movements of the upper contact portion of the upper contact arm of the contact and the lower contact portion of the lower contact arm can be adjusted by changing the slits of the elastic member in shape, wherein the elastic member is accommodated in a first recess as the accommodating recess provided on the upper base member and in a second recess, formed in opposition to the first recess, as the accommodating recess provided on the lower base member, and at least a part of the elastic member is interposed between the upper base member and the lower base member, wherein the elastic member includes an upper portion and a lower portion, the upper portion and the lower portion being formed deviating back and forth from each other, the slits being formed in a region, in which the upper portion and the lower portion overlap each other, the upper portion of the elastic member is accommodated in the first recess of the upper base member, the lower portion of the elastic member being accommodated in the second recess of the lower base member, and a front portion of the upper portion of the elastic member and a rear portion of the lower portion, respectively, are interposed between the upper base member and the lower base member.

6. The electrical connecting device according to claim 5, wherein the lower contact arm has the lower contact portion and includes a contact projection protruding downward from the lower contact portion.

* * * * *